United States Patent
Smith et al.

(10) Patent No.: US 7,268,360 B2
(45) Date of Patent: Sep. 11, 2007

(54) METHOD AND APPARATUS FOR SELF-REFERENCED DYNAMIC STEP AND SCAN INTRA-FIELD SCANNING DISTORTION

(75) Inventors: Adlai H. Smith, Escondido, CA (US); Robert O. Hunter, Jr., Snowmass Village, CO (US); Bruce B. McArthur, San Diego, CA (US)

(73) Assignee: Litel Instruments, San Diego, CA (US)

( * ) Notice: Subject to any disclaimer, the term of this patent is extended or adjusted under 35 U.S.C. 154(b) by 27 days.

(21) Appl. No.: 11/202,707

(22) Filed: Aug. 11, 2005

(65) Prior Publication Data

US 2006/0007431 A1    Jan. 12, 2006

Related U.S. Application Data

(63) Continuation-in-part of application No. 11/102,382, filed on Apr. 8, 2005, and a continuation-in-part of application No. 10/252,021, filed on Sep. 20, 2002, now Pat. No. 6,906,303.

(60) Provisional application No. 60/323,577, filed on Sep. 20, 2001.

(51) Int. Cl.
*G01N 21/86* (2006.01)
*G01N 21/93* (2006.01)

(52) U.S. Cl. ................... 250/559.1; 250/559.3; 250/548; 355/52

(58) Field of Classification Search ............. 250/559.3, 250/559.1, 548; 355/53, 55, 52
See application file for complete search history.

(56) References Cited

U.S. PATENT DOCUMENTS 4,861,148 A    8/1989    Santo et al.
(Continued)

FOREIGN PATENT DOCUMENTS

JP    58137213 A  *  8/1983

OTHER PUBLICATIONS

KLA 5200, "Value-added Overlay Metrology for Advanced Lithography", KLA 5200 Product Specifications, KLA Instruments Corporation, 2 pages, (1996).*

(Continued)

*Primary Examiner*—Georgia Epps
*Assistant Examiner*—Christopher M Yealy

(57) ABSTRACT

Techniques for determining wafer stage grid and yaw in a projection imaging tool are described. The techniques include exposing an overlay reticle onto a substrate having a recording media, thereby creating a plurality of printed fields on the substrate. The overlay reticle is then positioned such that when the reticle is exposed again completed alignment attributes are created in at least two sites in a first and a second printed field. The substrate is then rotated relative to the reticle by a desired amount. The overlay reticle is then positioned such that when the reticle is again exposed, completed alignment attributes are created in at least two sites in the first and a third printed field. Measurements of the complementary alignment attribute and a dynamic intra-field lens distortion are then used to reconstruct wafer stage grid and yaw error of the projection imaging system.

21 Claims, 30 Drawing Sheets

U.S. PATENT DOCUMENTS

| | | | |
|---|---|---|---|
| 5,285,236 A | 2/1994 | Jain | |
| 5,402,224 A | 3/1995 | Hirukawa et al. | |
| 5,438,413 A | 8/1995 | Mazor et al. | |
| 5,477,058 A * | 12/1995 | Sato | 250/548 |
| 5,615,006 A | 3/1997 | Hirukawa et al. | |
| 5,757,507 A | 5/1998 | Ausschnitt et al. | |
| 5,770,863 A * | 6/1998 | Nakasuji | 250/492.2 |
| 5,877,861 A | 3/1999 | Ausschnitt et al. | |
| 5,894,350 A | 4/1999 | Hsieh et al. | |
| 6,077,756 A * | 6/2000 | Lin et al. | 438/401 |
| 6,079,256 A * | 6/2000 | Bareket | 73/105 |
| 6,083,650 A * | 7/2000 | Ogusu et al. | 430/22 |
| 6,093,931 A | 7/2000 | Sugihara et al. | |
| 6,143,621 A | 11/2000 | Tzeng et al. | |
| 6,153,886 A | 11/2000 | Hagiwara et al. | |
| 6,204,912 B1 | 3/2001 | Tsuchiya et al. | |
| 6,259,525 B1 | 7/2001 | David | |
| 6,356,343 B1 * | 3/2002 | Shiraishi et al. | 355/77 |
| 6,558,852 B1 * | 5/2003 | Tawarayama et al. | 430/5 |
| 6,573,986 B2 | 6/2003 | Smith et al. | |
| 6,734,971 B2 | 5/2004 | Smith et al. | |
| 6,906,303 B1 | 6/2005 | Smith et al. | |
| 6,906,780 B1 | 6/2005 | Smith et al. | |
| 6,975,974 B2 * | 12/2005 | Chien et al. | 703/2 |
| 7,068,833 B1 * | 6/2006 | Ghinovker et al. | 382/144 |
| 2002/0113218 A1* | 8/2002 | Okumura et al. | 250/548 |
| 2005/0219516 A1 | 10/2005 | Smith et al. | |
| 2005/0240895 A1 | 10/2005 | Smith et al. | |

OTHER PUBLICATIONS

Armitage Jr., J.D. et al, "Analysis of overlay distortion patterns", Procs. of SPIE 921:207-222 1988.

Bjorkholm et al., "Reduction Imaging at 14 nm Using Multilayer-Coated Optics: Printing of Features Smaller than 0.1 µm", J. Vac. Sci. Technol. B., 8(6):1509-1543 (1990).

Bruning et al., "Optical Lithography—Thirty Years and Three Orders of Magnitude", Proc. of SPIE, 3051:14-27 (1997).

Cote et al., "MicrascanTM III-Performance of a Third Generation, Catadioptric Step and Scan Litographic Tool", Proc. of SPIE, 3051:806-816 (1997).

DeJule, R., "Mix and Match: A Necessary Choice", Semiconductor International, 23(2):66-76 (2000).

de Zwart et al., "Performance of a Step and Scan System for DUV Lithography", Proc. of SPIE, 3051:817-835 (1997).

Dooly et al., "Stepper Matching for Optimum Line Performance", Proc. of SPIE, 3051:426-432 (1997).

Goodwin et al., "Characterizing Overlay Registration of Concentric 5X and 1X Stepper Exposure Fields Using Interfield Data", Proc. of SPIE, 3050:407-417 (1997).

Hasan et al., "Automated Electrical Measurements of Registration Errors in Step-and-Repeat Optical Lithography Systems", IEEE Transactions on Electron Devices, ED27(12):2304-2312 (1980).

Kemp et al., "A 'Golden Standard' Wafer Design for Optical Stepper Characterization", Proc. of SPIE, 1464:260-266 (1991).

KLA 5000 Series Applicate Note, "Overlay Target Design",KLA Instruments Corporation, 4 pages, (1996).

KLA 5105, "Linewidth and Misregistration System", KLA 5105 Product Specification, KLA Instruments Corporation, 2 pages (1995).

KLA 5200, "Value-added Overlay Metrology for Advanced Lithography", KLA 5200 Product Specifications, KLA Instruments Corporation, 2 pages, (1996).

Kodama et al., "Measuring System XY-5i", Proc. of SPIE, 2439:144-155 (1995).

Leica LMS IPRO, "Fully Automated Mask and Wafer Metrology System", Leica, pamphlet pp. 1-5.

Lin, B.J., "The Attenuated Phase-Shifting Mask", Solid State Technology, Special Series/Advanced Lithography, 35(1):43-47, (Jan. 1992).

MacMillen et al., "Analysis of Image Field Placement Deviations of 5X Microlithographic Reduction Lens", Proc. of SPIE, 334:78-89 (1982).

Martin et al., "Measuring Fab Overlay Programs", Proc. of SPIE, 3677:64-71 (1999).

McFadden et al., "A Computer Aided Engineering Workstation for Registration Control", Proc. of SPIE, 1087:255-266 (1989).

Mulkens et al., "ArF Step and Scan Exposure System for 0.15 µm Technology Node?", Proc. of SPIE, 3679:506-521 (1999).

Newman et al., "Development of XUV Projection Lithograph at 60-80 nm", Proc. of SPIE, 1671:419-436 (1992).

Pellegrini, J.C., "Comparisons of Six Different Intrafield Control Paradigms in an Advanced Mix-and-Match Environment", Proc. of SPIE, 3050:398-406 (1997).

Pellegrini et al., "Super Sparse Overlay Sampling Plans: An Evaluation of Methods and Algorithms for Optimizing Overlay Quality Control and Metrology Tool Throughput", Proc. of SPIE. 3677:72-82 (1999).

Preil et al., "A New Approach to Correlating Overlay and Yield", Proc. of SPIE, 3677:208-216 (1999).

Press et al., Numerical Recipes, "The Art of Scientific Computing", Cambridge University Press, New York, pp. 52-64 (1990).

Quaestor Q7, "Fully Automated Optical Metrology System for Advanced IC Production", Quaestor Q7 Product Specification, BIO-RAD, 2 pages.

Rai-Choudhury, P., Handbook of Microlithography, Micromachining and Microfabrication, Book: vol. 1, "Microlithography", SPIE Optical Engineering Press, Proc. of SPIE, Bellingham, Washington, pp. 417-418 (1997).

Raugh, M.R., "Error Estimation for Lattice Methods of State Self-Calibration", Proc. of SPIE, 3050:614-625 (1997).

Sullivan, N.T., "Semiconductor Pattern Overlay", Proc. of SPIE Critical Reviews of Optical Science and Technology, CR52:160-188 (1994).

Takac et al., "Self-Calibration in Two-Dimensions: The Experiment", Proc. of SPIE, 2725:130-146 (1996).

van den Brink et al., "Direct-Referencing Automatic Two-Points Reticle-to-Wafer Alignment Using a Projection Column Servo System", Proc. of SPIE, 633:60-71 (1986).

van den Brink et al., "Matching Management of Multiple Wafer Steppers Using a Stable Standard and Matching Simulator", Proc. of SPIE, 1087:218-232 (1989).

van den Brink et al., "Matching of Multiple Wafer Steppers for 0.35 µm Lithography Using Advanced Optimization Schemes", Proc. of SPIE, 1926:188-207 (1993).

van den Brink et al., "Matching Performance for Multiple Wafer Steppers Using an Advanced Metrology Procedure", Proc. of SPIE, 921:180-197 (1988).

van Schoot et al., "0.7 NA DUV Step & Step System for 150nm Imaging with Improved Overlay", Proc. of SPIE, 3679:448-463 (1999).

Yost et al., "Lens Matching and Distortion Testing in a Multi-Stepper, Sub-Micron Environment", Proc. of SPIE, 1087:233-244 (1989).

Zavecz et al., "Life Beyond Mix-and-Match: Controlling Sub-0.18 µm Overlay Errors", Semiconductor International, 23(8):205,206,208,210,212 and 214 (2000).

Zavecz, T.E., "Machine Models and Registration", Proc. SPIE Critical Reviews of Optical Science and Technology, CR52:134-159 (1994).

* cited by examiner

Box-in-box

Frame-in-frame

Segmented frame-in-frame

Multi-segmented frame-in-frame

Gratings
Solid lines=AA
Dashed lines=AA'

Pair of wafer alignment marks

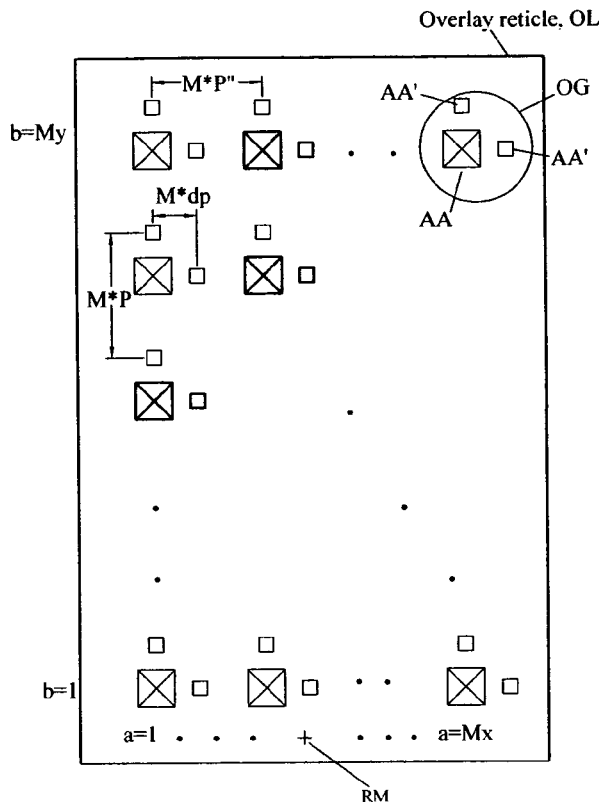
Figure 6
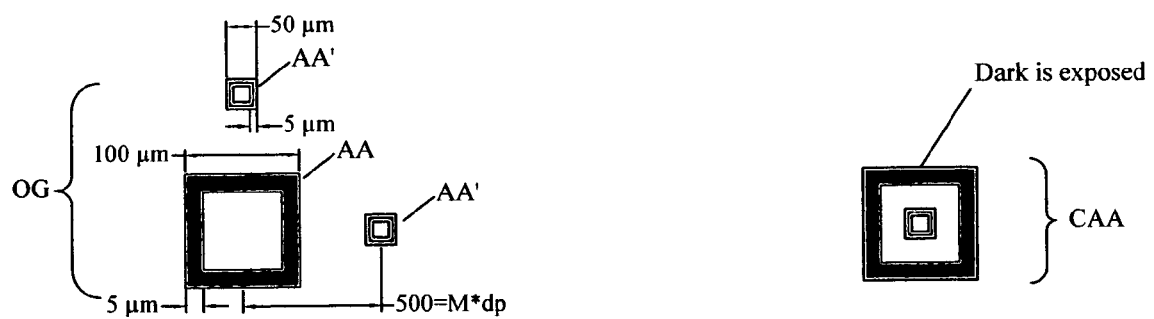
Figure 7
Figure 8

Reticle Pattern

Pattern on wafer

Overlay group after first exposure, wafer at 0°

Overlay group after exposures done at 90°, lower portion (R1)

Overlay group after exposures done at 90°, upper portion (R1)

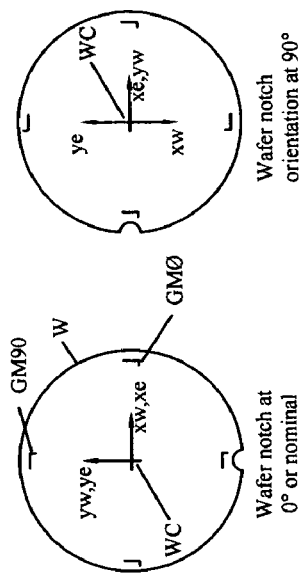
Figure 27
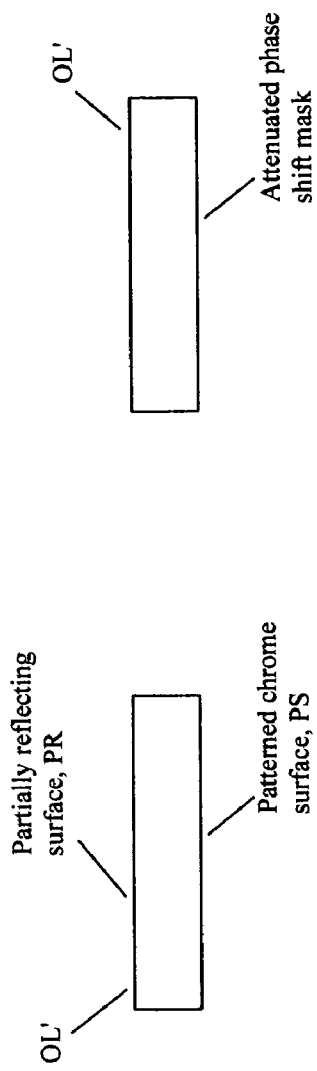
Figure 29
Figure 28
Figure 30

Machine ID No.: DUVX22
Process / Layer: 686 / Contact
Date: 4/23/01
Units: Microns / Microradians Wafer Stage Grid and Yaw

| IP | XC(IP) | YC(IP) | TXWS(IP) | TYWS(IP) | QWS(IP) |
|---|---|---|---|---|---|
| 1 | -70000 | -60000 | 0.015 | -0.032 | 0.043 |
| 2 | -50000 | -6000 | -0.125 | 0.041 | -0.122 |
| . | . | . | . | . | . |
| . | . | . | . | . | . |
| . | . | . | . | . | . |

Figure 46

METHOD AND APPARATUS FOR SELF-REFERENCED DYNAMIC STEP AND SCAN INTRA-FIELD SCANNING DISTORTION

REFERENCE TO PRIORITY DOCUMENT

This application is a continuation-in-part, and claims the benefit of priority, of co-pending U.S. patent application Ser. No. 11/102,382 entitled "Method and Apparatus for Self-Referenced Dynamic Step and Scan Intra-Field Scanning Distortion", filed Apr. 8, 2005 and U.S. patent application Ser. No. 10/252,021, entitled "Method and Apparatus for Self-Referenced Dynamic Step and Scan Intra-Field Scanning Distortion", filed Sep. 20, 2002 now U.S. Pat. No. 6,906,303, which claimed the benefit of priority of U.S. Provisional Patent Application Ser. No. 60/323,577, entitled "Method for Self-Referenced Dynamic Step and Scan Intra-Field Scanning Distortion", filed Sep. 20, 2001. Priority of the filing date of Sep. 20, 2001 is hereby claimed, and the disclosures of U.S. patent application Ser. No. 11/102,382, U.S. patent application Ser. No. 10/252,021, and U.S. Provisional Patent Application Ser. No. 60/323,577 are hereby incorporated in their entirety by reference.

BACKGROUND

1. Field of the Invention

The present invention relates generally to processes for semiconductor manufacturing and more particularly to characterizing and monitoring the intra-field distortions of scanning projection systems used in ULSI photolithography.

2. Description of the Related Art

Today's lithographic processing requires ever tighter layer-to-layer overlay tolerances to meet device performance requirements. Overlay registration on critical layers can directly impact device performance, yield and repeatability. Typical microelectronic devices or circuits may have as many as 20 or more levels or pattern layers. The placement of patterned features on one level must match the placement of corresponding features on other levels—that is, they must overlap—within an accuracy which is some fraction of the minimum feature size or critical dimension (CD).

Overlay error is typically, although not exclusively, measured with a metrology tool appropriately called an overlay tool using several techniques. See Semiconductor Pattern Overlay, N. Sullivan, SPIE Critical Reviews Vol. CR52, 160:188. The term overlay metrology tool or overlay tool means any tool capable of determining the relative position of two alignment attributes that are separated within about 2000 um (microns) of each other. The importance of overlay error, and its impact on yield, have been extensively studied and documented. See Measuring Fab Overlay Programs, R. Martin et al., SPIE Conference on Metrology, Inspection, and Process Control for Microlithography XIII, 64:71, March 1999; A New Approach to Correlating Overlay and Yield, M. Preil et al., SPIE Conference on Metrology, Inspection, and Process Control for Microlithography XIII, 208:216, March 1999.

Lithographers have created statistical computer algorithms (for example, Klass II (See Lens Matching and Distortion Testing in a Multi-Stepper, Sub-Micron Environment, A. Yost et al., SPIE Vol. 1087, 233:244, 1989) and Monolith (See A Computer Aided Engineering Workstation for Registration Control, E. McFadden et al., SPIE Vol. 1087, 255:266, 1989)) that attempt to quantify and divide overlay error into repeatable or systematic and non-repeatable or random effects. See Matching of Multiple Wafer Steppers for 0.35 Micron Lithography Using Advanced Optimization Schemes, M. van den Brink et al., SPIE Vol. 1926, 188:207, 1993; A Computer Aided Engineering Workstation for Registration Control, supra; Semiconductor Pattern Overlay, supra; Machine Models and Registration, T. Zavecz, SPIE Critical Reviews Vol. CR52, 134:159. An overall theoretical review of overlay modeling can be found in the literature. See Semiconductor Pattern Overlay, supra.

Overlay error is typically divided into the following two major categories. The first category, inter-field or grid overlay error, is concerned with the actual position of the translation and rotation or yaw of the image field as recorded in the photoresist on a silicon wafer using an exposure tool, i.e., stepper or scanner. The second category, intra-field overlay error, is the positional offset of an individual point inside a field referenced to the nominal center of an individual exposure field. Intra-field overlay errors are generally composed of lens aberrations or distortions, scanning irregularities, and reticle alignment.

It is important for this discussion to realize that most overlay measurements are made on silicon product wafers after each photolithographic process, prior to final etch. Product wafers cannot be etched until the photoresist target patterns are properly aligned to the underlying target patterns. See Super Sparse Overlay Sampling Plans: An Evaluation of Methods and Algorithms for Optimizing Overlay Quality Control and Metrology Tool Throughput, J. Pellegrini, SPIE Vol. 3677, 72:82. Manufacturing facilities rely heavily on exposure tool alignment and calibration procedures to help insure that the scanner tools are aligning properly. See Stepper Matching for Optimum Line Performance, T. Dooly et al., SPIE Vol. 3051, 426:432, 1997; Mix-and-Match: A Necessary Choice, R. DeJule, Semiconductor International, 66:76, February 2000; Matching Performance for Multiple Wafer Steppers Using an Advanced Metrology Procedure, M. Van den Brink, et al., SPIE Vol. 921, 180:197, 1988. Inaccurate overlay modeling algorithms can corrupt the exposure tool calibration procedures and degrade the alignment accuracy of the exposure tool system. See Super Sparse Overlay Sampling Plans: An Evaluation of Methods and Algorithms for Optimizing Overlay Quality Control and Metrology Tool Throughput, supra.

Over the past 30 years the microelectronics industry has experienced dramatic rapid decreases in critical dimension by constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 Micron Overlay Errors, T. Zavecz, Semiconductor International, July 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra. In particular, those new overlay methodologies that can be implemented into advanced process control or automated control loops will be most important. See Comparisons of Six Different Intra-Field Control Paradigms in an Advanced Mix and Match Environment, J. Pellegrini, SPIE Vol. 3050, 398:406, 1997; Characterizing Overlay Registration of Concentric 5X and 1X Stepper Exposure Fields Using Inter-Field Data, F. Goodwin et al., SPIE Vol. 3050, 407:417, 1997. Finally, another area where quantifying lens distortion error is of vital concern is in the production of photo masks or reticles during the electron beam manufacturing process. See Handbook of Microlithography and Microfabrication, P. Rai-Choudhury, Vol. 1, 417 1997.

Semiconductor manufacturing facilities use some version of the following complex overlay procedure to help determine the magnitude of intra-field distortion independent of other sources of systematic overlay error—in fact, the technique is used for both photolithographic steppers and scanners. The technique has been simplified for illustration. See Analysis of Image Field Placement Deviations of a 5× Microlithographic Reduction Lens, D. MacMillen et al., SPIE Vol. 334, 78:89, 1982. FIG. 33 shows a typical overlay target—one large or outer box and one small or inner target box. FIG. 31 shows a typical portion of a distortion test reticle used in the prior art. It should be noted that the chrome target patterns on most reticles are 4 or 5 times larger as compared with the patterns they produce at the image plane, this simply means modern step and scan systems (scanners) are reduction imaging systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, see FIG. 2, is exposed onto the photoresist-coated wafer. See FIGS. 31 and 32. For purposes of illustration, it is assumed that the distortion test reticle consists of a 5×5 array of outer boxes evenly spaced a distance M*P, across the reticle surface, see FIG. 2. It is typically assumed that the center of the optical system is virtually aberration free. See Analysis of Image Field Placement Deviations of a 5× Microlithographic Reduction Lens, supra. With this assumption, the reticle, shown in FIG. 2 is now partially covered using the virtual reticle blades, as shown in FIG. 18, in such a way that only a single target at the center of the reticle field, box A in FIG. 2, is available for exposure. Next, the wafer stage is moved in such a way as to align the center of the reticle pattern directly over the upper left hand corner of the printed 5×5 outer box array, wafer position 1 in FIG. 31. The scanner then exposes the image of the small target box onto the photoresist coated wafer. If the wafer stage, optical system and scanning dynamics were truly perfect then the image of the small target box would fit perfectly inside the image of the larger target box, see FIG. 33, from the previous exposure. At this point the scanner and wafer stage are programmed to step and expose the small target box in the 5×5 array where each exposure is separated from the previous one by the stepping distance P.

With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes. Since the first full-field exposure pattern is in fact distorted due to an imperfect imaging system (and scanner system) the actual position of the larger target box will be displaced relative to the smaller target boxes. The wafer is then sent through the final few steps of the lithographic process to create the final photoresist patterned overlay targets.

The resulting overlay error at each field position can be measured with a standard optical overlay tool and the result is interpreted as being intra-field error. Using the models described below in Equations 1 and 2, the overlay data can be analyzed and the lens distortion error is calculated.

The following intra-field modeling equations are commonly used to fit the overlay data using a least square regression technique. See Analysis of Image Field Placement Deviations of a 5× Microlithographic Reduction Lens, supra; Super Sparse Overlay Sampling Plans: An Evaluation of Methods and Algorithms for Optimizing Overlay Quality Control and Metrology Tool Throughput, supra.

$$dxf(xf,yf)=Tx+s*xf-q*yf+t1*xf^2+t2*xf*yf-E*(xf^3+xf*yf^2) \quad \text{Equation 1}$$

$$dyf(xf,yf)=Ty+s*yf+q*xf+t2*yf^2+t1*xf*yf-E*(yf^3+yf*xf^2) \quad \text{Equation 2}$$

where;
(xf,yf)=intra-field coordinates
(dxf, dyf)(xf,yf)=intra-field distortion at position (xf,yf)
(Tx, Ty)=(x,y) intra-field translation
s=intra-field overall scale or magnification
q=intra-field rotation
(t1, t2)=intra-field trapezoid error
E=intra-field lens distortion.

A problem with this technique is two-fold, first, it is standard practice to assume that the wafer stage error is very small, randomly distributed, and can be completely accounted for using a statistical model. See Analysis of Image Field Placement Deviations of a 5× Microlithographic Reduction Lens, supra; A "Golden Standard" Wafer Design for Optical Stepper Characterization", K. Kenp et al., SPIE Vol. 1464, 260:266, 1991; Matching Management of Multiple Wafer Steppers Using a Stable Standard and a Matching Simulator, M. Van den Brink et al., SPIE Vol. 1087, 218:232, 1989; Matching Performance for Multiple Wafer Steppers Using an Advanced Metrology Procedure, supra. In general, positional uncertainties in the wafer stage introduces both systematic and random errors, and since the intra-field distortion is measured only in reference to the lithography tool's wafer stage, machine to machine wafer stage differences show up as inaccurate intra-field distortion maps. Secondly, the assumption that lens distortion is zero at the center of the lens is incorrect. Furthermore, the model represented by Equations 1 and 2 is entirely unsuited to modeling scanner overlay error—typically the intra-field distortion model accounts only for scanner skew and scanner scale overlay errors—in general, the synchronization errors between the reticle stage and wafer stage introduce more complex errors described below.

A technique for stage and 'artifact' self-calibration is described in See Self-Calibration in two-Dimensions: The Experiment, M. Takac et al., SPIE Vol. 2725, 130:146, 1996; Error Estimation for Lattice Methods of Stage Self-Calibration, M. Raugh, SPIE Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor.

This technique has several drawbacks, including that it requires that the measurements be performed on the same machine that is being assessed by this technique. Furthermore, this technique requires measurements made on a tool in absolute coordinates; the metrology tool measures the absolute position of the printed targets relative to its own nominal center; so absolute measurements are required over the entire imaging field, with a typical size greater than about 100 mm$^2$).

Another technique for the determination of intra-field distortion is the method of Smith, McArthur, and Hunter ("Method And Apparatus For Self-Referenced Projection Lens Distortion Mapping", U.S. patent application Ser. No. 09/835,201, now U.S. Pat. No. 6,573,986). It is a self-referencing technique that can be utilized with overlay metrology tools in a production environment. For diagnosing the intra-field scanner distortion in the presence of significant scanner non-repeatability, this technique teaches the use of a special reticle that has reduced optical transmission that is multiply scanned producing sub-Eo exposures on the wafer. The result is that this technique can be used to accurately determine the repeatable part of the scanner intra-field distortion but not that part of the intra-field distortion that changes from scan to scan, a simple example of which is the scanner y-magnification.

Another drawback to these techniques to determine intra-field error is that they use the scanner itself as the metrology tool. Due to the cost of scanners, which can exceed 10 million dollars, it is desirable to have a technique for intra-field error that does not use the scanner itself as the metrology tool for determining intra-field distortion but utilizes relatively inexpensive overlay metrology tools. Furthermore, it is desirable that the technique be easy to perform thereby allowing it to be used in a production environment by the day-to-day operating personnel. It is further desirable to have a technique that measures the non-repeatable parts of the scanner intra-field distortion.

Therefore there is a need for an effective, and efficient, way to determine the scanner intra-field error.

SUMMARY

In accordance with the invention, techniques for determining wafer stage grid and yaw in a projection imaging tool are described. The techniques include exposing an overlay reticle in at least three positions onto a substrate having a recording media. This exposure creates a plurality of printed fields on the substrate. The overlay reticle is then positioned such that, when the reticle is exposed again, completed alignment attributes are created in at least two sites in first and second printed fields. The substrate is then rotated relative to the reticle by a desired amount. The overlay reticle is then positioned such that when the reticle is again exposed, completed alignment attributes are created in at least two sites in the first printed field and in a third printed field. Measurements of the complementary alignment attribute and a dynamic intra-field lens distortion are then used to reconstruct wafer stage grid and yaw error of the projection imaging system.

Rotating the substrate a desired amount can include rotating 90 degrees. Also, the measurements of the complementary alignment attribute can be made with an overlay metrology tool. Different types of substrates can include a semiconductor wafer, a flat panel display, a reticle, or an electronic recording media. Different types of projection imaging systems can include a photolithograph step and scan machine, a photolithographic scanner machine, a scanning electron beam imaging system, a scanning direct write tool, a scalpel tool, a scanning extreme ultra-violet photolithographic tool, or a scanning x-ray imaging system. In addition, the recording media can include a positive photoresist material, a negative photoresist material, an electronic CCD, a diode array, a liquid crystal, or an optically sensitive material.

Determining wafer stage grid and yaw in a projection imaging tool can also include exposing an overlay reticle in at least four positions onto a substrate having a recording media, thereby creating a plurality of printed fields, then positioning the overlay reticle such that, when the reticle is exposed again, completed alignment attributes are created in at least two sites in first and second printed fields. The overlay reticle is then positioned such that when the reticle is exposed again, completed alignment attributes are created in at least two additional sites in third and fourth printed fields. The substrate is then rotated 90 degrees and the overlay reticle positioned such that, when the reticle is exposed, completed alignment attributes are created in at least two sites in the first and third printed fields. Again, the overlay reticle is positioned such that when the reticle is now exposed completed alignment attributes are created in at least two sites in the second and fourth printed fields. Measurements of the complementary alignment attribute and a dynamic intra-field lens distortion are used to reconstruct wafer stage grid and yaw error of the projection imaging system.

The operation of the projection imaging system can be adjusted in response to the reconstructed wafer grid and yaw error. For example, a controller in the projection imaging system can adjust the operation of the imaging system in response to the reconstructed wafer grid and yaw error. The positioning of the reticle relative to the substrate can be accomplished by a translation stage such as a wafer stage or a reticle stage or both. Likewise the substrate can be rotated relative to the wafer by a rotational stage, such as a wafer stage, reticle stage, or both.

The techniques can be used to improve semiconductor fabrication that uses a photolithographic projection tool. For example, operation of the projection imaging system can be adjusted in response to the reconstructed wafer grid and yaw error to improve throughput, or yield, in a semiconductor fabrication process.

Other features and advantages of the present invention should be apparent from the following description of the preferred embodiment, which illustrates, by way of example, principles of the invention.

BRIEF DESCRIPTION OF THE DRAWINGS

FIG. 6 is a schematic of the reticle for the preferred embodiment for extracting dynamic intra-field scanning error.

FIG. 7 is an exemplary overlay group, OG, for a dark field mask with dimensions in microns.

FIG. 8 is a completed alignment attribute using AA and AA' of FIG. 7.

FIG. 27 shows the wafer coordinate systems used in the discussion of this invention.

FIG. 28 shows in cross section a partially transmitting variation of the present invention that utilizes a partially reflecting surface as the transmission reduction mechanism.

FIG. 29 shows in cross section a partially transmitting variation of the present invention that utilizes an attenuated phased shift mask on the surface as the transmission reduction mechanism.

FIG. 30 shows in cross section another variation of the present invention that utilizes a reflective reticle.

FIG. 46 is a table illustrating an exemplary output listing of stage grid and yaw errors for a scanner operating in dynamic mode.

DETAILED DESCRIPTION

An aspect of the invention is that it does not require that measurements be made on the same machine that is being assessed accordingly determining the intra-field lens distortion can, and preferably are, made on an overlay metrology tool quite distinct from the projection lithography tool that we are assessing.

Another aspect of the invention is that the absolute position of the printed targets relative to the nominal center of the metrology tool is not required, instead relative coordinates or displacements of features (box in box structures or some other alignment attribute) are measured with respect to each other. Because the distances between these alignment attributes is typically less than 2.0 mm absolute position is not required. In the case of box in box structures these distances are typically less than about 0.2 mm. This difference is a significant one since absolute metrology tools such as the Leica LMS 2000, Leica IPRO (See Leica LMS IPRO Brochure), or Nikon 5I (See Measuring System XY-5i, K. Kodama et al., SPIE Vol. 2439, 144:155, 1995) typically cost in excess of 2 million dollars and are uncommon in semiconductor manufacturing facilities (fabs) while overlay metrology tools such as the KLA 5200, or Bio-rad Q7 typically cost about half a million dollars or more and are widely deployed in fabs. Another drawback of this technique is that it requires that the intra-field distortion be repeatable from exposure to exposure, this is precluded by the scanner dynamics.

Another aspect of the invention is that it utilizes a procedure that greatly reduces the number of measurements required to determine the intra-field lens distortion. Furthermore, the technique allows for the determination of the non-repeatable part of the scanner dynamic distortion.

Figure 4:
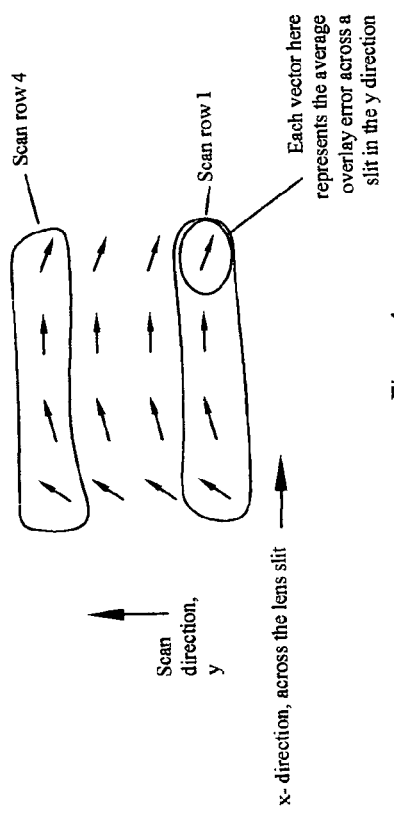
FIG. 4 shows vector plots or lens distortion error in the absence of scanner synchronization error.
Figure 18:
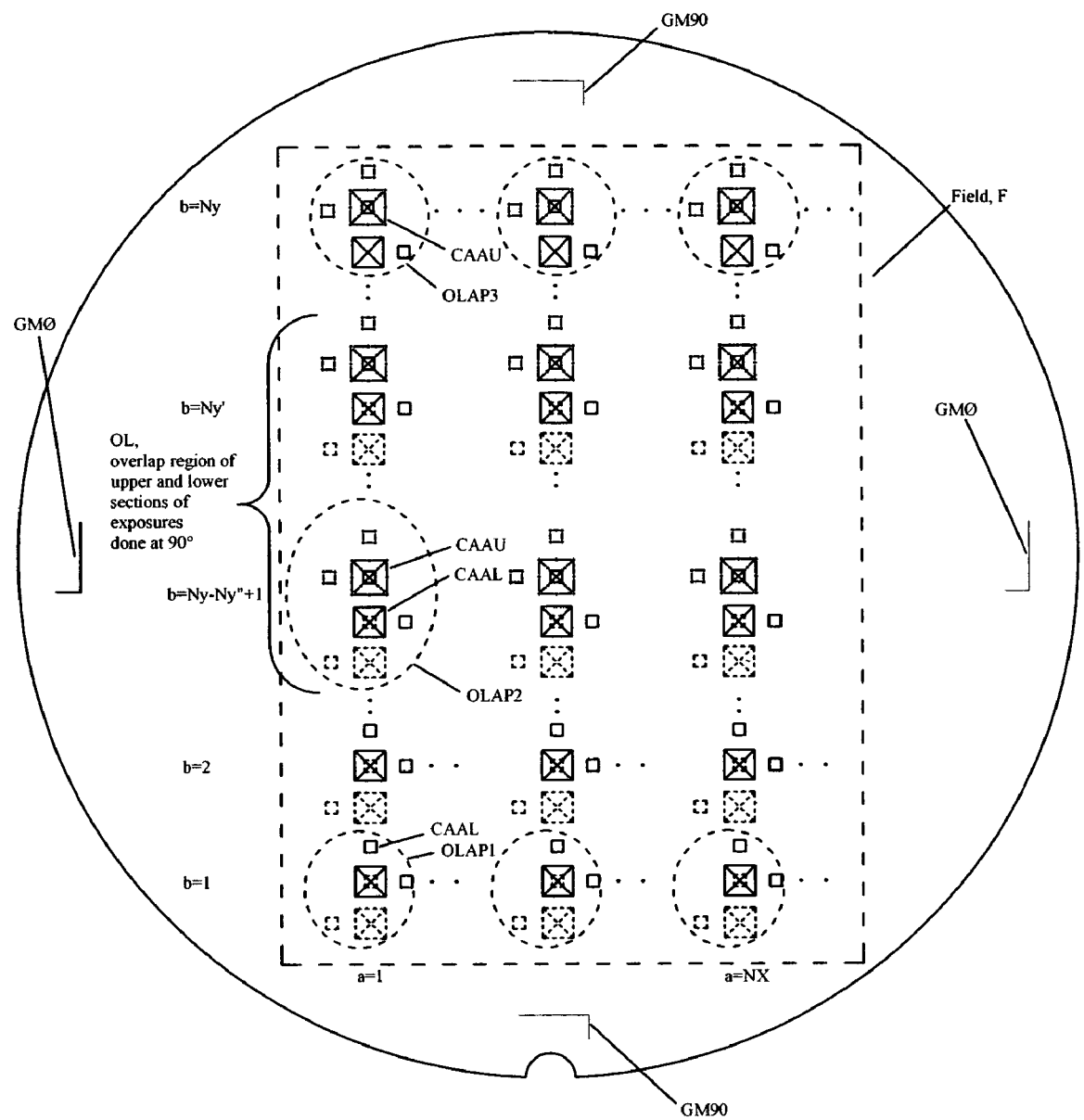
FIG. 18 shows a wafer after exposures done at 0 degrees and 90 degrees.

The structure of scanner intra-field distortion or translational error can be decomposed into a lens component, dependent only on the projection imaging objective or projection system aberrations (See FIG. 4), and a scanning component, dependent only on the relative dynamics of the wafer and reticle scanning motion. (See FIG. 5.) The lens component is repeatable but the scanning component contains both repeatable and non-repeatable parts. Furthermore, the lens and scanning components have certain functional forms that simplify the extraction of intra-field error. A photolithographic step and scan or scanner system produces an image, typically reduced 4× or 5×, of the reticle pattern in the surface of the photoresist by continuously passing exposure radiation through a small portion of the projection optics as the reticle and wafer stage travel in opposite directions, as shown in FIG. 18. The scanning reticle stage and scanning wafer stage move in opposite directions in a coordinated manner at two different speeds.

Figure 1:
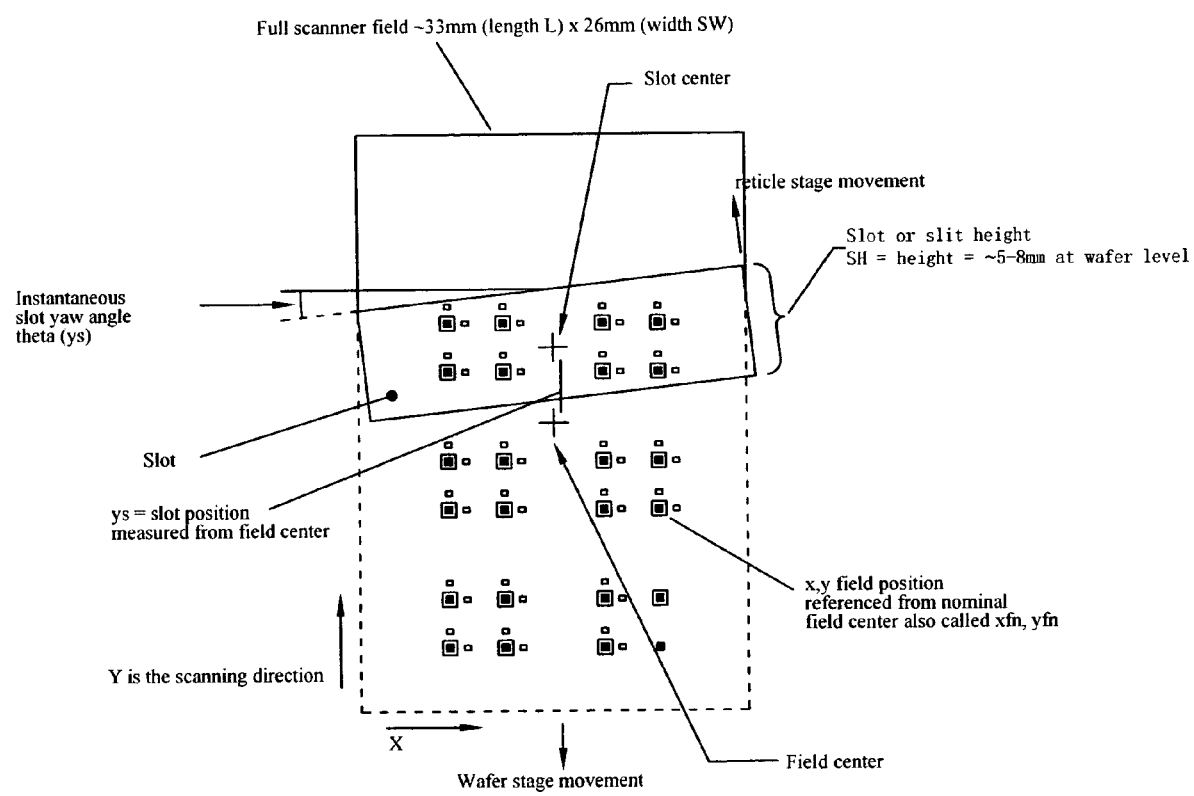
FIG. 1 shows a scanner exposure field, scanner slit and scanner coordinate system.
Figure 2:
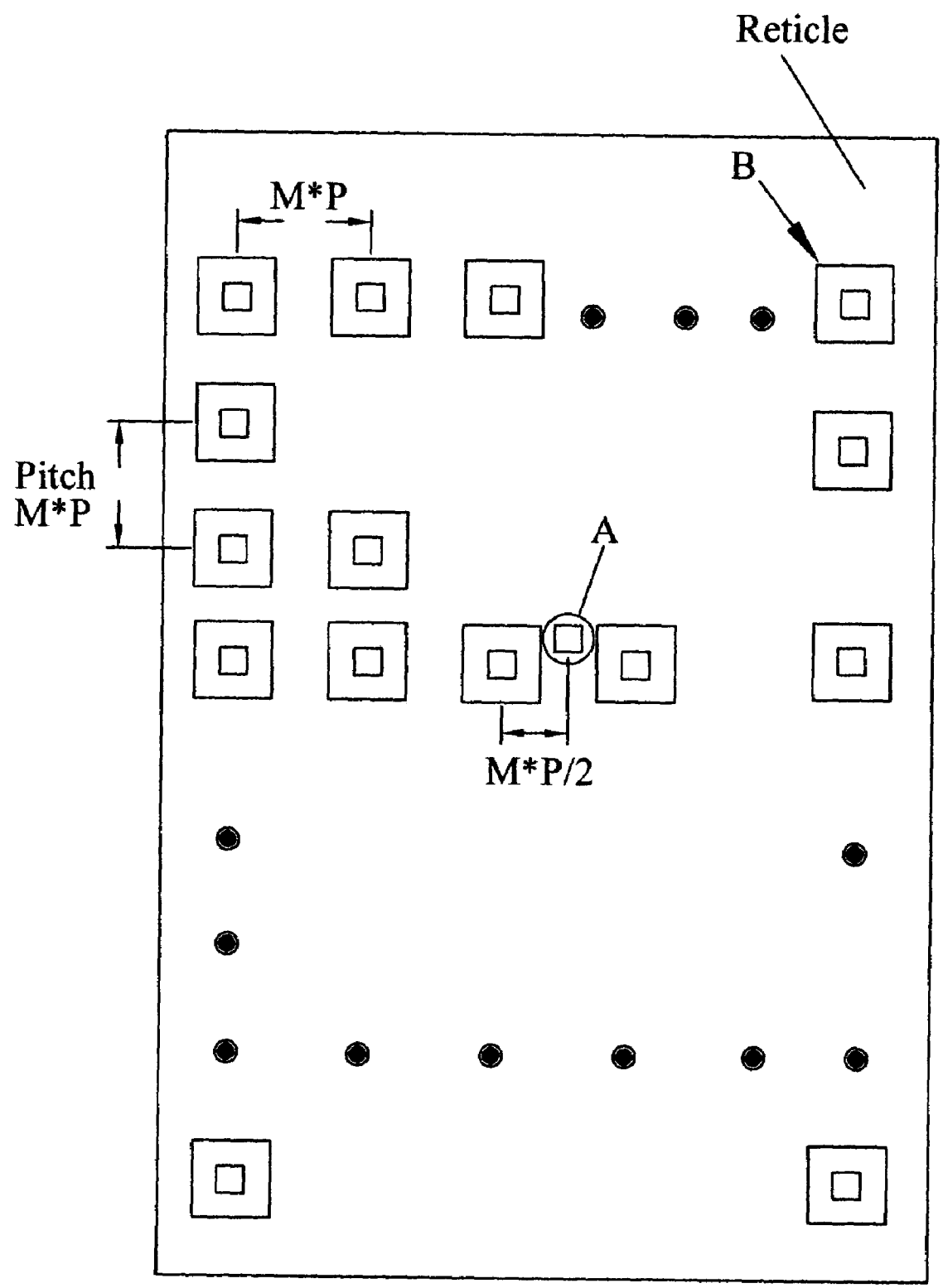
FIG. 2 schematizes a reticle used for stage metered scan and lens distortion.

FIG. 1 shows an instantaneous (top down) view of a partially exposed scanner field (and coordinate system) as it might appear on a photoresist coated silicon wafer during a scan. Lack of coordination between the wafer stage and reticle stage in the absence of lens distortion will manifest itself as translational offset error—$\Delta T(x,y,ys)$. Where $\Delta T(x,y,ys)$ is defined to be the instantaneous translational offset error on the wafer at intra-field position x,y—located inside the image of the lens slit—when the scanner is at position (ys), See FIG. 1. The final distortion error or overlay error ($\Delta F(x,y)$) at any point actually imaged in the photoresist is then an average of the instantaneous errors ($\Delta T(x,y,ys)$), weighted by the intensity function of the scanning slit. If the scanner operated perfectly (without synchronization or vibration errors) then the final distortion or translational error, $\Delta sL(x)$ at each field point in the photoresist would simply be the average of the static projection lens distortion $\Delta d(x)$ weighted by the intensity function of a static scanner slit. See aberration averaging; Performance of a Step and Scan System for DUV Lithography, G. de Zwart et al., SPIE Vol. 3051, 817:835, 1997.

Thus, there are two independent sources of transverse scanning error or scanning distortion; projection lens distortion error—that varies in magnitude and direction across the scanner field (in the x direction, or perpendicular to the scanning direction) and synchronization errors that represent an average of the instantaneous (repeatable and non-repeatable) positional offsets of the wafer and reticle stage.

Because the reticle and wafer move in a coordinated manner as rigid bodies relative to one another, lack of coordination will show up as instantaneous offset errors, ($\Delta Tx, \Delta Ty)(x,y,ys)$. Here ($\Delta Tx, \Delta Ty)(x,y,ys)$ is the instantaneous translational offset error of the projected image at the wafer relative to a perfectly placed wafer is a function not only of the intra-field coordinate (x,y) but also of the instantaneous position, ys, of the wafer relative to the center of the scanning slit. FIG. 1 shows the relation of the full scanner field and field center relative to the slot center, this relative position is ys. We are concerned here only with transverse errors of the stage and reticle and so the instantaneous offset vector ($\Delta Tx, \Delta Ty)(x,y,ys)$ will depend only on the instantaneous translational offset error ($\Delta X(ys), \Delta Y(ys)$) and the instantaneous yaw or rotational error θs(ys) as:

$$(\Delta Tx, \Delta Ty)(x,y,ys) \times (\Delta X(ys)+\theta s(ys)*(y-ys), \Delta Y(ys)-\theta s(ys)*x) \qquad \text{Equation 3}$$

Another contributor to the instantaneous offset vector will arise from the static distortion contribution of the projection lens. Thus if ($\Delta Xs1, \Delta Ys1)(x,y)$ is the static lens distortion then its contribution to the instantaneous offset vector ($\Delta Tx, \Delta Ty$) will be:

$$(\Delta Tx, \Delta Ty)(x,y,ys)=(\Delta Xs1, \Delta Ys1)(x,y-ys) \qquad \text{Equation 4}$$

The static lens distortion means the intra-field distortion of the scanner as determined when the wafer and reticle stages are not moved with respect to one another to produce the scanned image field. Thus, the static lens distortion does not include any contribution from synchronization or dynamic yaw errors due to the relative motion of the reticle and wafer stages. Referring to FIG. 1, ($\Delta Xs1, \Delta Ys1)(x,y)$ is defined only over the slot width (SW) and slot height (SH). Therefore x, y vary over the ranges $$x=(-SW/2:SW/2) \; y=(-SH/2:SH/2) \qquad \text{Equation 5}$$

There are various techniques for determining ($\Delta Xs1, \Delta Ys1$), a very accurate technique is described in "Method And Apparatus For Self-Referenced Projection Lens Distortion Mapping" (A. H. Smith, B. B. McArthur, R. O. Hunter, Jr., U.S. patent application Ser. No. 09/835,201) but this and other techniques for measuring static lens distortion are not required for the techniques described below.

Combining Equations 3 and 4 give the total contribution to the instantaneous offset error as:

$$(\Delta Tx, \Delta Ty)(x,y,ys)=(\Delta Xs1, \Delta Ys1)(x,y-ys)+(\Delta X(ys)+\theta s(ys)*(y-ys), \Delta Y(ys)-\theta s(ys)*x) \qquad \text{Equation 6}$$

Here x,y vary over the entire span of intrafield coordinates;

$$x=(-SW/2:SW/2) \, y=(-L/2:L/2) \qquad \text{Equation 7}$$

while ys varies over the range:

$$ys=(y-SH/2:y+SH/2) \qquad \text{Equation 8}$$

Since the projected image suffers a shift only when the slot (or more precisely any part of the illuminated slot) is over field position (x,y).

The effect of the projected image is then just a weighted average over the slot of the instantaneous offsets ($\Delta Tx, \Delta Ty$):

$$(\Delta XF, \Delta YF)(x,y)=\text{INT}\{dys*w(y-ys)*(\Delta Tx, \Delta Ty)\blacklozenge(x,y,ys)\}\text{INT}\{dys*w(y-ys)\} \qquad \text{Equation 9}$$

where;

x,y=intrafield coordinates, x=(-SW/2:SW/2), y=(-L/2:L/2)

ys=the position of the center of the scanning slit at a given instant in time referenced from the nominal die center.

SW=slot width

L=scanner field length dys=differential amount of the scanner field

INT{ }=integral over the scanner field, integration range extends from ys=(-(L+SH)/2: (L+SH)/2))

w(y)=weighting function. In 248 nm resists, typically proportional to the slot intensity profile scanning slit. 0 for points outside the slit opening.

($\Delta XF, \Delta YF)(x,y)$=intrafield distortion. Includes effects of scanning synchronization error and lens aberrations.

The two distinct parts of ($\Delta Tx, \Delta Ty$) (scanner dynamics (Equation 3) and lens distortion (Equation 4)) are additive and therefore the intrafield distortion, ($\Delta XF, \Delta YF$), can also be divided up into similar parts as:

$$(\Delta XF, \Delta YF)(x,y)=(\Delta xL, \Delta yL)(x)+(\Delta XS(y), \Delta YS(y)-x*d\Delta YS(y)/dx) \qquad \text{Equation 10}$$

where the lens aberration contribution, ($\Delta xL, \Delta yL)(x)$, is given by;

$$(\Delta xL, \Delta yL)(x)=\text{INT}\{dys*w(y-ys)*(\Delta Xs1, \Delta Ys1)(x,y-ys)\}\text{INT}\{dys*w(y-ys)\} \qquad \text{Equation 11}$$

and the scanning dynamics contribution, ($\Delta XS(y), \Delta YS(y)-x*d\Delta YS(y)/dx$), is given by;

$$(\Delta XS(y), \Delta YS(y)-x*d\Delta YS(y)/dx)=\text{INT}\{dys*w(y-ys)*(\Delta X(ys)+\theta s(ys)*(y-ys), \Delta Y(ys)-\theta s(ys)*x)\}/\text{INT}\{dys*w(y-ys)\} \qquad \text{Equation 12}$$

Identifying separate components in Equations 11 and 12 gives the individual expressions for the various components of overlay error. Thus the dynamic slip in the x and y directions due to synchronization error is given by;

$\Delta XS(y)$=dynamic slip in the $x$ direction=$INT\{dys*w(ys)*\Delta X(y-ys)\}/INT\{dys*w(ys)\}$     Equation 13

$\Delta YS(y)$=dynamic slip in the $y$ direction=$INT\{dys*w(ys)*\Delta Y(y-ys)\}/INT\{dys*w(ys)\}$     Equation 14 the dynamic yaw or rotational error due to synchronization error is given by;

$d\Delta YS(y)/dx$=dynamic yaw =$INT\{dys*w(ys)*\theta s(ys))\}/INT\{dys*w(ys)\}$     Equation 15

The influence of the dynamic lens distortions on the intra-field error, ($\Delta xL$, $\Delta yL$), is given by;

$\Delta xL(y)$=dynamic lens distortion in the $x$ direction=$INT\{dys*w(ys)*\Delta Xs1(y-ys)\}/INT\{dys*w(ys)\}$     Equation 16

$\Delta yL(y)$=dynamic lens distortion in the $y$ direction=$INT\{dys*w(ys)*\Delta Ys1(y-ys)\}/INT\{dys*w(ys)\}$     Equation 17

The interpretation of the structure of the intra-field distortion, ($\Delta XF$, $\Delta YF$), is best understood with reference to Equation 10. There, the intra-field distortion is divided into a contribution by the dynamic lens distortion, ($\Delta xL$, $\Delta yL$), that depends only on the cross scan coordinate, x, and is independent of the position along the scanning direction, y. From Equations 16 and 17, the dynamic lens distortion is a weighted average of the static lens distortion where the weighting factor, w(y), depends on the intensity distribution in the scan direction, y, possibly the photoresist process, and the scanning direction. Because the dynamic lens distortion contains none of the effects of scanning synchronization errors and only effects that are highly repeatable, the dynamic lens distortion will not vary from scan to scan. Thus, the contribution of dynamic lens distortion to the intrafield distortion can be some arbitrary set of vector displacements along a single scan row but will be the same for all rows in the scan, see FIG. 4.

Figure 5:
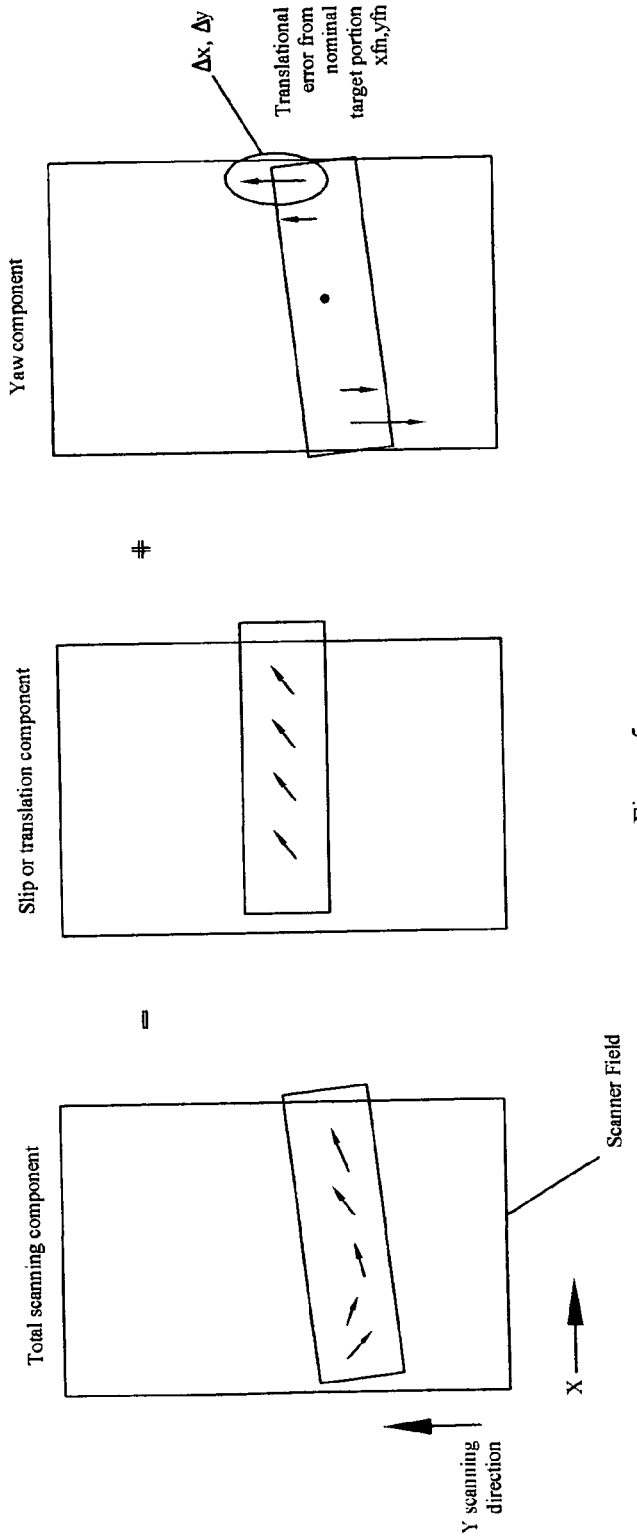
FIG. 5 shows the components making up the instantaneous scanning synchronization error.

The other contributor to intra-field distortion in Equation 10 is the dynamic slip and yaw errors, $\Delta XS(y)$, $\Delta YS(y)$, $d\Delta YS(y)/dx$, which depend on the position along the scanning direction, y, and are independent of the cross scan coordinate, x. From Equations 13, 14, and 15 the dynamic slip and yaw are convolutions of the weighting factor w(y) with the instantaneous translational and yaw offsets. Because dynamic slip and yaw contain nothing but the effects of scanner synchronization error, they will contain both repeatable parts that do not vary from scan to scan and non-repeatable parts that vary from scan to scan. Referring to FIG. 5, each row of the scan will have different translation and rotation errors that are generally different and strongly correlated only over distances less than about SH, the slot height.

In summary; in the presence of both lens distortion and scanner synchronization error the total overlay distortion error, [$\delta X(x,y)$, $\delta Y(x,y)$] can be expressed in the following form;

$\delta X(x,y)=\Delta XS(y)+\Delta xL(x)$,     Equation 18

$\delta Y(x,y)=\Delta YS(y)+\Delta yL(x)-x*d\Delta YS(y)/dx$     Equation 19

In acid catalyzed photoresists such as those used for KrF or 248 nm lithography, the weighting function will typically be directly proportional to the intensity of light, I(y), across the slot since the latent acid image does not saturate until at very high exposure doses. However, in typical I-line photoresists the latent image saturates at normal exposure doses. This means that at a given location on the photoresist, the exposing light that first impinges consumes a larger portion of the photoactive material than an equal amount of exposing light impinging at a later time. Thus the w(y) will not be proportional to I(y) any longer. Because of this saturation effect, the weighting function will depend not only on the photoresist exposure dose used but also on the scanning direction (positive y or negative y).

FIRST EMBODIMENT

Figure 12:
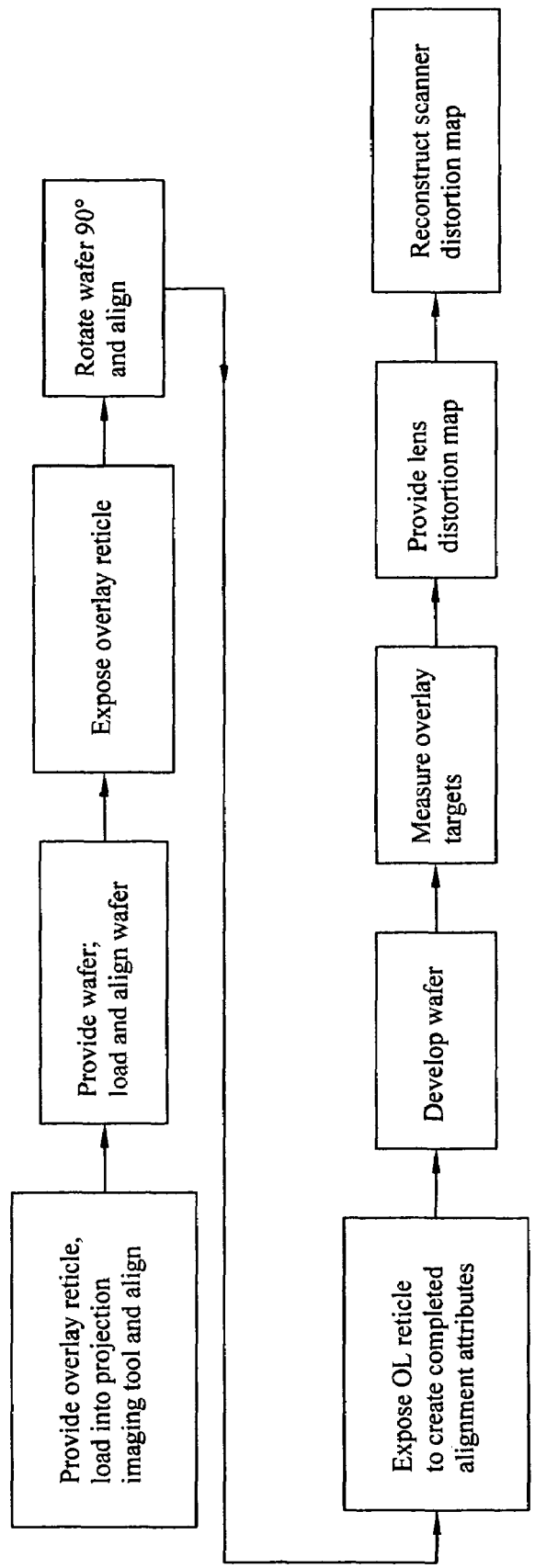
FIG. 12 shows the process flow for the preferred embodiment of this invention.

A method for determining the distortion associated with scanner synchronization error (scan error for short) to within a translation, rotation, and skew in the presence of scanner lens distortion is described. The process flow for the first embodiment is diagramed in FIG. 12.

Provide Reticle

Figure 9:
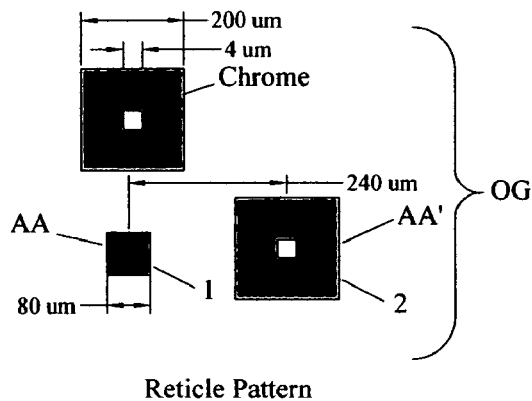
FIG. 9 shows on the left exemplary overlay group OG for a bright field mask and on the right overlay group OG as projected onto the wafer at 4:1 reduction.
Figure 9:
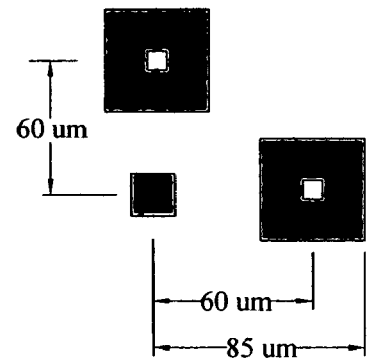

Referring to FIG. 6, a reticle, OL, with an (Mx×My) array of overlay groups, OG, is provided, loaded into a projection lithography tool (machine) being measured, and aligned to reticle alignment mark RM. Reticle OL, shown in cross section in FIG. 11, may be a glass or fused silica reticle with a chrome coating that defines the overlay groups, OG; it is a binary mask. FIGS. 7 and 9 show realizations of OG for the first embodiment. They both consist of alignment attributes, AA, and complementary alignment attributes, AA', offset from AA a distance M*dp. When overlaid one on top of another, AA and AA' form completed alignment attributes, CAA, illustrated in FIGS. 8 and 10. FIG. 8 is the completed alignment attribute, CAA, as viewed on the wafer consisting of the projection of alignment attribute AA and complementary alignment attribute AA' of FIG. 7 on top of one another. The inner square torus of FIG. 8 represents the projection of AA' while the outer square torus represents the projection of AA onto the wafer. The darkened areas represent exposed photoresist or other recording media.

FIG. 7 is a realization of overlay group OG for a dark field mask. The darkened areas represent chrome removed from the reticle and typical dimensions in microns are shown. These dimensions are appropriate when overlay reticle OL is used in a 4:1 (M=4 in FIG. 6) or 5:1 (M=5 in FIG. 6) reduction imaging tool. When used in a 1:1 imaging tool (no magnification or demagnification of the image size) the dimensions shown in FIG. 7 would be reduced by approximately 4-5 times so that the completed alignment attributes (CAA of FIG. 8) would be within the recommended size range for bar in bar structures suitable for an overlay metrology tool, typically about 15-30 um. See Overlay Target Design, KLA-Tencor, KLA-Tencor, 1:4, 1996. M*dp of FIG. 6 is the distance between alignment attributes AA and their complements AA' and for the example of FIG. 7 is equal to 500 microns.

Figure 10:
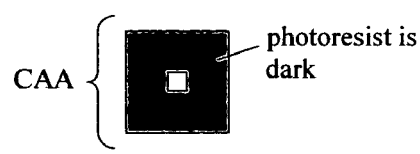
FIG. 10 shows a completed alignment attribute using AA and AA' of FIG. 9 as printed in positive photoresist.
Figure 11:
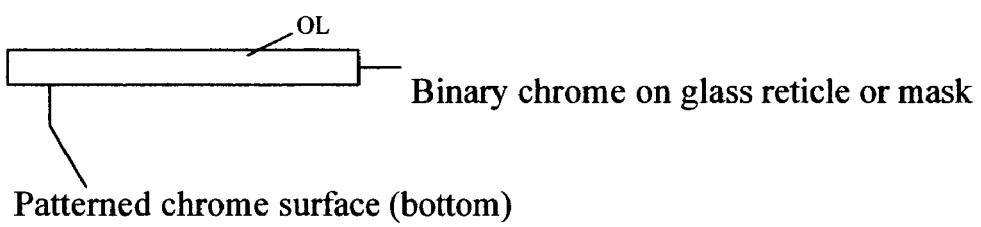
FIG. 11 is a side view of the reticle of FIG. 6.

FIG. 9 is another realization of overlay group OG, this time for a bright field mask. The darkened areas represent chrome remaining on the reticle and typical dimensions in microns are shown. These dimensions are appropriate when overlay reticle OL is used in a 4:1 (M=4 in FIG. 6) or 5:1 (M=5 in FIG. 6) reduction imaging tool. The same comments above apply to the design basis for this size and adaptation to imaging tools with other magnifications, M. M*dp of FIG. 6 is the distance between alignment attributes AA and their complements AA' and for the example of FIG. 9 is equal to 500 microns. FIG. 10 is the completed alignment attribute, CAA, as viewed on the wafer consisting of the projection of alignment attribute AA and complementary alignment attribute AA' of FIG. 9 on top of one another. The inner square box of FIG. 8 represents the projection of AA' while the outer square box represents the projection of AA onto the wafer. The darkened areas represent resist remaining on the wafer, in the case of a positive tone resist.

Referring to FIG. 6, overlay groups OG are separated a distance M*p" where p" is typically in the range of 0.5 mm to 10 mm when used on semiconductor wafers. M is the reduction magnification ratio of the projection imaging tool used. For semiconductor manufacturing this is typically M=1, 4 or 5, most commonly 4 or 5. Thus an exemplary dimension for M*p" for an M=4 or M=5 system is 4 mm leading to a pitch, p", of the projected pattern on the wafer of p"=1 mm (M=4) or p"=0.8 mm (M=5). Typical values for p" are in the range of 0.5 mm to 10 mm while typical values for dp are 0.02 mm to 1 mm. The significant constraint on p" is that it be small enough to provide detailed enough coverage of the scan distortion pattern. Stated differently, we need to sample the scan distortion at a fine enough interval such that the distortions at the unmeasured locations in between the overlay groups are reasonably approximated (error less than 30% maximum distortion) by interpolating the values of scan distortion measured on pitch p". The significant constraint on offset dp is that it lie within an area where the scan distortion is not varying significantly. Stated differently, the overlay group of FIG. 6 should lie within an isoplanatic distortion patch of the scan field, herein defined as being a region over which the scanner distortion varies by less than about 5% of the maximum value of the scan distortion.

Also disposed on overlay reticle OL will be reticle alignment marks, RM, that allow the reticle to be precisely aligned with respect to the projection imaging tool it is used on.

The number of overlay groups OG on reticle OL is determined by the maximum projected field size of the machine or set of machines we will be measuring. In cases where the extent of the overlay groups on the reticle exceeds the size of the maximum field, the entire Mx×My array is not required, a smaller section that fits within the maximum field or other user designated field will work with the method of this invention.

Load/Align Reticle

Next, overlay reticle OL is loaded into the projection lithography tool (machine) and aligned. The reticle alignment is typically carried out using reticle alignment marks, RM. On lower accuracy machines, larger alignment attributes AA and their complements, AA', when combined with mechanical banking or placement of the reticle may suffice for reticle alignment. In these circumstances, no reticle alignment marks would be required.

Provide/Load/Align Wafer

Figure 16:
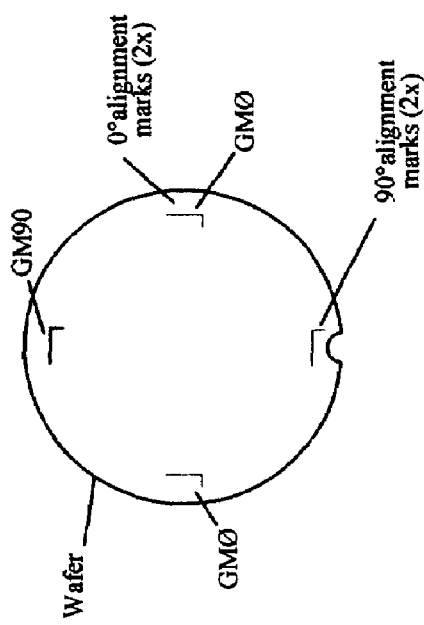
FIG. 16 shows a wafer with wafer alignment marks suitable for using the wafer at 0 and 90 degree orientations.

Next, a photoresist coated wafer is provided. Referring to FIG. 16, this wafer may have already disposed on it global wafer alignment marks GM0 and GM90. GM0 is the wafer alignment mark suitable for the wafer when it is loaded with the notch in the default or 0 degree orientation. Two marks, shown in FIG. 16, and possibly more, are typically required for wafer alignment. The required alignment accuracy for semiconductor wafers and standard box in box or bar in bar completed alignment attributes will typically be less than about 2 um. This is so the overlay tool metrology used for measuring the completed alignment attributes is operating in the regime where it is most accurate and repeatable. See KLA 5105 Overlay Brochure, KLA-Tencor. GM90 is the alignment mark suitable for the wafer when loaded with the notch in the rotated 90 degrees from the default or 0 degree orientation. Two marks are shown in FIG. 16. In cases where the wafer prealignment system can meet the required tolerances by aligning off of the wafer edge and notch, an unpatterned wafer can be used. Once provided, the wafer is then loaded and aligned on the projection lithography tool we are measuring.

Expose Reticle

Figure 17:
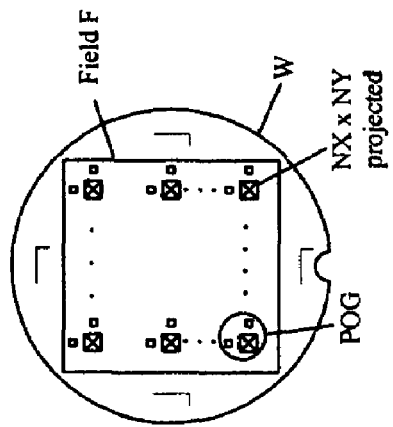
FIG. 17 shows a wafer after the first exposure for determining the dynamic scan distortion.

Next, referring to FIG. 17, overlay reticle OL is exposed projecting an Nx×Ny array of overlay groups, OG, from reticle OL onto wafer W resulting in an Nx×Ny array of projected overlay groups, POG, on wafer W. The entire projected array comprises a field F over which we will be measuring the machine dynamic scan distortion; the present invention will determine the synchronization or dynamic distortion present in this single realization of scanning distortion as present in the field F.

Rotate/Align Wafer

Following the first exposure the wafer is rotated by 90 degrees and realigned using global wafer alignment marks GM90. For the rotation step, the wafer may have to pass out through the track, skipping the resist development cycle and be passed back through track, skipping the resist coating cycle, and reinserted onto the wafer chuck. In some cases, the wafer may need to be rotated by hand approximately 90 degrees before the machine prealignment system can accommodate it. In any event, once the wafer has been rotated, it is then aligned as discussed above only the GM90 marks are utilized. In this case the global wafer alignment marks GM0 remain individually identical in appearance once they have been rotated by 90 degrees, then in their new position they can serve the same function as marks GM90. For the purposes of this invention the wafer can be rotated either clockwise or counterclockwise by 90 degrees. The description of the preferred embodiment assumes the wafer is rotated clockwise by 90 degrees as indicated by FIG. 27.

Expose OL Reticle to Create Completed Alignment Attributes

Figure 15:
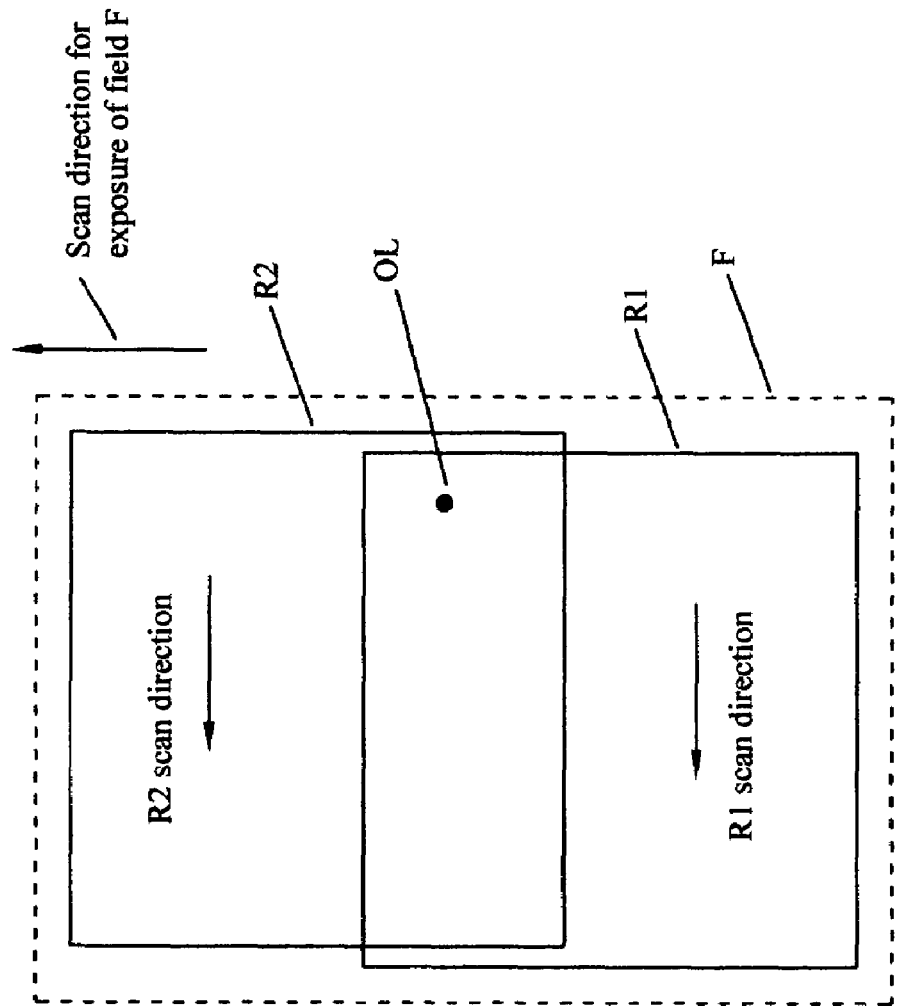
FIG. 15 shows an exposure plan for determining dynamic scan error of field F.
Figures 19, 20:
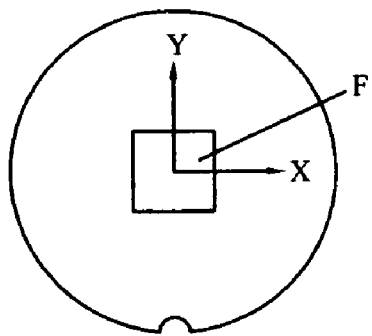
FIG. 19 shows the intrafield coordinate convention.
FIG. 20 shows schematics used in FIG. 18.
Figure 34:
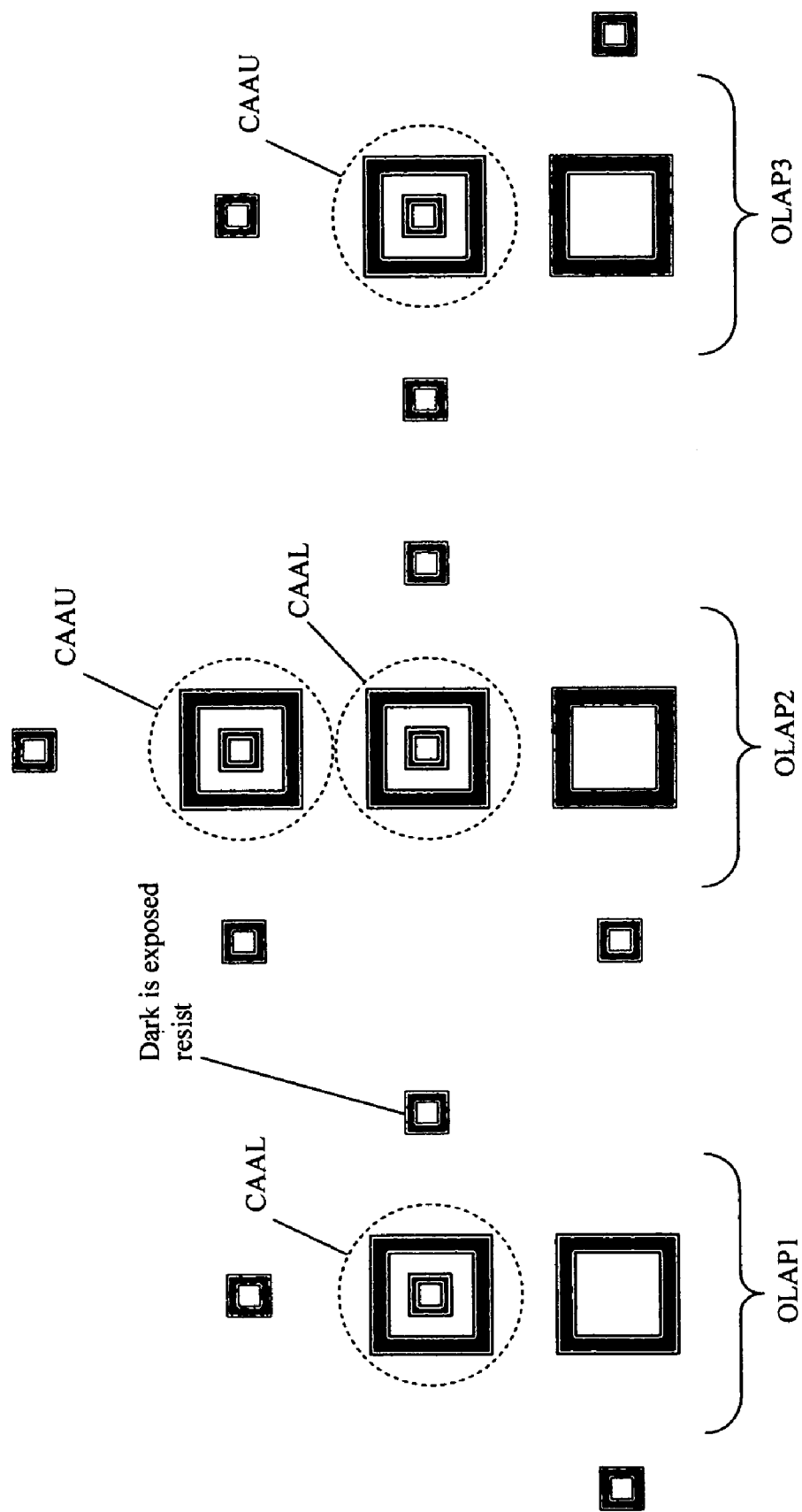
FIG. 34 shows OLAP1, OLAP2, and OLAP3 as realized with overlay group of FIG. 7.

Next the wafer is exposed with the overlay reticle OL one or more times resulting in an Nx×Ny array of projected overlapped overlay groups consisting of one or more of the following types, OLAP1, OLAP2 or OLAP3, (See FIGS. 18 and 34). Referring to FIG. 15, field F is shown as a dashed rectangle longer than it is wide and with the scanning direction indicated by an arrow. This is typical of the dimensions of a scanned field since the purpose of the scanning mechanism is to enlarge the projected imaging field by utilizing the mechanical synchronization of the wafer and reticle stage and thereby minimize the area projected by imaging objective. See Optical Lithography— Thirty Years and Three Orders of Magnitude, J. Bruning, SPIE Vol. 3051, 14:27, 1997. Typical maximum scanned field dimensions for semiconductor wafer scanners are 22×32.5, 25×33, 26×33, and 26×34 is (SW×L in mm per FIG. 1). Thus for semiconductor wafer scanners, to create completed alignment attributes at all Nx×Ny projected overlay groups two separate scans (with fields R1 and R2 in FIG. 15) are required. While the fields R1 and R2 could be done without any overlay region, OL, the resulting measurement set of completed alignment attributes could only partially determine the dynamic scan error over the entire field. While this can be useful in the case where only a small portion of the entire scanned field is to be analyzed or the projected field of interest is small enough that only a single field, R1, will overlay the field of interest, F, the overlapping 2-field case represents the preferred embodiment. Cases where fewer or more fields are required to overlap F are easily adapted from this embodiment. FIG. 20 explicitly shows which overlay groups in FIG. 18 result from which exposure first, R1, R2).

When viewed with the notch at nominal or 0 degree orientation, (See FIG. 18), exposure R1 of reticle OL of FIG. 6 consists of an Nx×Ny' array of overlay groups (dashed lines of FIG. 18) placed to form completed alignment attributes, CAAL, when combined with the overlay groups defined by the field F exposure (solid lines of FIG. 18). Ny' is less than Ny allowing R1 to be placed so. If the field F has been exposed with center located at wafer coordinates (xc,yc) then for the reticle layout of FIG. 6, then the center of exposure R1 will be made at exposure coordinates (FIG. 27) (xe,ye)=(yc−p"*(Ny−Ny')/2−dp, −xc). Exposure coordinates (xe,ye) do not rotate with the wafer but coincide with the wafer coordinates when the wafer has its notch at the 0 degree or nominal orientation. Both wafer and exposure coordinates have the wafer center, WC of FIG. 27, as their origin. So, having completed the R1 exposure, there results an Nx× Ny' array of completed alignment attributes for the lower portion of the field F (CAAL of FIG. 18).

Next, exposure R2 is made covering the upper portion of field F and consisting of an Nx×Ny" array of overlay groups (dash dot lines of FIG. 18) that are placed to form an Nx×Ny" array of completed alignment attributes, CAAU, for the upper portion of field F. Ny" is less than Ny so the CAAU array extends from row b=Ny−Ny"+1 to b=Ny. So that we can diagnose the scan distortion over the entire field F, the lower and upper exposures, R1 and R2, need to overlap at least two overlay groups. Referring to FIG. 18, rows b=Ny−Ny"+1 through b=Ny' will consist of projected overlapped overlay groups OLAP2 each of which consists of completed alignment attributes CAAL and CAAU. In terms of Ny' and Ny" this means Ny'+Ny">=Ny+2. With the field F placed at (xc,yc), exposure R2 will be placed at exposure coordinate (xe,ye)=(yc+p"*(Ny−Ny")/2+dp, −xc) resulting in the dash dot overlay groups of FIG. 18.

The net result of exposures F, R1 and R2 is to create an Nx×Ny−Ny" array of projected overlapped overlay groups, OLAP1, each containing at least one completed alignment attribute, CAAL, of fields F and R1. Further, an Nx×Ny'−Ny+Ny" array of projected overlapped overlay groups, OLAP2, each containing at least one completed alignment attribute, CAAL, of fields F and R1 and at least one completed alignment attribute, CAAU, of fields F and R2. Further, an Nx×Ny−Ny'+1 array of projected overlapped overlay groups, OLAP3, each containing at least one completed alignment attribute, CAAU, of fields F and R2.

Develop Wafer

The wafer is then developed.

Measure Overlay Targets

Next, an overlay metrology tool is used to determine the positional offset error of at least two columns of completed alignment attributes. Thus, in the first embodiment, the two outer columns, a=1 and a=Nx of FIG. 18 would be measured. Within each measured column, all completed alignment attributes, Ny'CAAL and Ny" CAAU, for a total of Ny'+Ny" would be measured. The effect of not measuring an alignment attribute CAAL or CAAU is that we lose information concerning scanner distortion for that particular row, however we need to measure at least two rows where the alignment attributes lie within OLAP2 groups.

Provide Lens Distortion Map

Next, a map of the dynamic lens distortion for the machine being measured is provided. The dynamic lens distortion (Equation 4) represents the effect of lens aberrations on intrafield distortion. Lens distortion is constant over short time periods (less than about one day) and therefore its contribution can be determined in advance and used for corrections and improvements in accuracy for the present determination of scanning distortion.

There are numerous methods for determining dynamic lens distortion the most accurate of which is the method of Smith, ("Method and Apparatus For Self-Referenced Dynamic Step And Scan Intra-Field Lens Distortion", U.S. Pat. No. 6,906,780). Another technique for the determination of lens distortion is the method of Smith, McArthur, and Hunter ("Method And Apparatus For Self-Referenced Projection Lens Distortion Mapping", U.S. patent application Ser. No. 09/835,201, now U.S. Pat. No. 6,573,986). This technique can be applied to measure the repeatable part of the scanner distortion along with the lens distortion, the resulting 2-dimensional field fit to the functional form for scanner intra-field distortion (Equation 10) and the dynamic lens distortion extracted. Yet another technique involves exposing a dynamic field a single time and measuring the absolute positions of the printed features using an absolute position metrology tool such as the LMS IPRO. See Leica LMS IPRO Brochure, supra. Again, the resulting 2-dimensional field fit to the functional form for scanner intra-field distortion (Equation 10) and the dynamic lens distortion extracted.

In cases where the scanning distortion is large compared to the lens distortion, the contribution from lens distortion can be neglected.

Reconstruct Scanner Distortion Map

Figure 14:
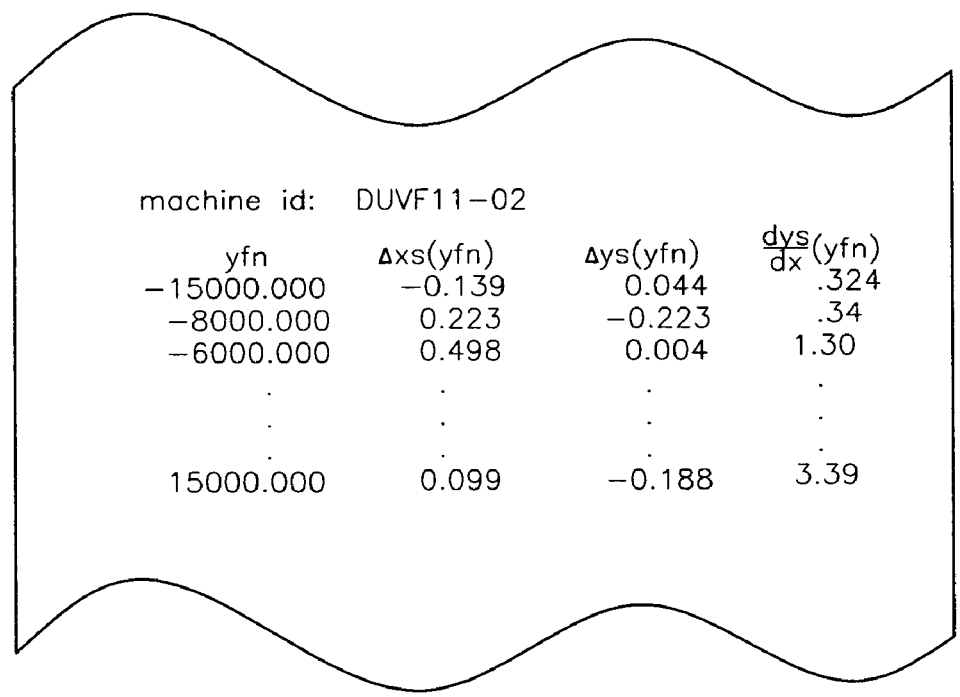
FIG. 14 shows a data file that represents the final results of the method of this invention.

At this point, a software algorithm is used to calculate the scanner distortion the result being a table, as shown in FIG. 14, consisting of the scanning distortion as a function of the scan (y) position. What follows are details of the software algorithm.

As noted above, and repeated here, Equations 18 and 19 show that the intrafield distortion error in the presence of scanner synchronization error and lens distortion is the sum of two vector parts;

$$\delta X(x,y) = \Delta XS(y) + \Delta xL(x), \quad \text{Equation 18}$$

$$\delta Y(x,y) = \Delta YS(y) + \Delta yL(x) - \Delta YR(x,y) \quad \text{Equation 19}$$

Where (x, y) are the intrafield coordinates. They are centered on field F and shown in FIG. 19. Also, $\Delta XS(y)$, $\Delta YS(y)$, represent the integrated average translational error associated with the scanning dynamics, $\Delta xL(x)$, $\Delta yL(x)$, represent the translational error associated with lens distortion and $\Delta YR(x,y)$ represents the integrated scanning average Yaw error ($\Delta YR(x,y)=x*[d\Delta YS(y)/dx]=x*[\theta avg(y)]$).

The deviation of the overlay groups in field F from their ideal positions (dxF,dyF)(x,y) is given by:

$$dxF(x,y) = Tx - q^*y + \Delta xL(x) + \Delta XS(y) \quad \text{Equation 20}$$

$$dyF(x,y) = Ty + q^*x + \Delta yL(x) + \Delta YS(y) + x^*\theta avg(y) \quad \text{Equation 21}$$

where Tx, Ty, q represent a gross intrafield translation and rotation due to reticle and stage mispositioning.

The deviation of the overlay groups in field R1 from their ideal positions (dxR1,dyR1)(x,y) is given by:

$$dxR1(x,y) = Tx' - q'^*y - \Delta yL(y + n1^*p'') + \Delta YS'(x) + y^*\theta'avg(x) \quad \text{Equation 22}$$

$$dyR1(x,y)=Ty'+q''^*x+\Delta xL(y+n1^*p'')+\Delta XS'(x) \quad \text{Equation 23}$$

where n1=when field R1 is centered within the maximum allowed exposure field and Tx', Ty', q' are another set of translations and rotation.

The deviation of the overlay groups in field R2 from their ideal positions (dxR2,dyR2)(x,y) is given by:

$$dxR2(x,y)=Tx''-q''^*y-\Delta yL(y-n2^*p'')+\Delta YS'(x)+y^*\theta''\text{avg}(x) \quad \text{Equation 24}$$

$$dyR2(x,y)=Ty''+q''^*x+\Delta xL(y-n2^*p'')+\Delta XS''(x) \quad \text{Equation 25}$$

where n2=when field R2 is centered within the maximum allowed exposure field and Tx", Ty", q" are yet another set of translations and rotation.

Denoting now the sign of the displacement for the outer box by + and the sign of the inner box by −, the lower completed alignment attributes, CAAL, produce overlay measurements:

$$BBx(x,y;L)=Tx-Tx'+\Delta xL(x)-\Delta YS'(x)+(-q+q'-\theta'\text{avg}(x))^*y+\Delta yL(y+n1^*p'')+\Delta XS(y) \quad \text{Equation 26}$$

$$BBy(x,y;L)=Ty-Ty'+\Delta yL(x)-\Delta XS'(x)+(q-q'+\theta\text{avg}(y))^*x-\Delta xL(y+n1^*p'')+\Delta YS(y) \quad \text{Equation 27}$$

while the upper completed alignment attributes, CAAU, produce overlay measurements:

$$BBx(x,y;U)=Tx-Tx''+\Delta xL(x)-\Delta YS''(x)+(-q+q''-\theta''\text{avg}(x))^*y+\Delta yL(y-n2^*p'')+\Delta XS(y) \quad \text{Equation 28}$$

$$BBy(x,y;U)=Ty-Ty''+\Delta yL(x)-\Delta XS''(x)+(q-q''+\theta\text{avg}(y))^*x-\Delta xL(y-n2^*p'')+\Delta YS(y) \quad \text{Equation 29}$$

In the region where R1 and R2 overlap the projected overlay groups, OLAP2, contain both an upper, CAAU, and lower, CAAL, completed alignment attribute. The difference between the upper and lower overlay measurements at the same position and putting the known lens distortions on the left hand side gives:

$$BBx(x,y;U)-BBx(x,y;L)-\Delta yL(y-n2^*p'')-\Delta yL(y+n1^*p'')=Tx''+Tx'-\Delta YS''(x)+\Delta YS'(x)+(q''-q'-\theta''\text{avg}(x)+\theta'\text{avg}(x))^*y \quad \text{Equation 30}$$

$$BBy(x,y;U)-BBy(x,y;L)-\Delta yL(y-n2^*p'')-\Delta yL(y+n1^*p'')=-Ty''+Tx'-\Delta XS''(x)+\Delta XS'(x)+(-q''+q')^*y \quad \text{Equation 31}$$

The interpretation of Equations 30 and 31 is that we know the translation and rotation of each column in the upper section relative to the lower section and that therefore, by applying Equations 30 and 31 at two or more points in y along each column, we can fix the location of the lower set of completed alignment attributes, CAAL, to the upper section of completed alignment attributes, CAAU.

Further interpreting Equations 26-29, considering a specific column or fixed x value, since the uncertainty or unknown part of the lens distortion will typically consist of a translation, rotation and x-scale. Based on these unknown quantities, and utilizing data from two distinct columns (y values) of field F, we will be able to determine $\Delta XS(y)$ to within an expression of the form $a+b^*y$, $\theta\text{avg}(y)$ to within a constant d, and $\Delta YS(y)$ to within a constant c. Taken altogether, we will be able to determine the scanner distortion ($\Delta XS(y)$, $\Delta YS(y)+\theta\text{avg}(y)^*x$) to within an expression of the form $(a+b^*y, c+d^*x)$ where a,b,c,d are unknown constants. In other words, we will know the scanning distortion to within a translation, rotation and skew (b term).

Equations 26-29 are typically solved using the singular value decomposition to produce the minimum length solution. See Numerical Recipes, The Art of Scientific Computing, W. Press et al., Cambridge University Press, 52:64, 1900. They are typically over-determined in the sense of equation counting (there are more equations than unknowns) but are still singular in the mathematical sense; there is an ambiguity in the solution of these equations. This ambiguity in the four parameter set discussed above for the wafer stage can also induce intrafield rotation errors.

At this point we have accomplished the last step in the process of this invention and we can record the final results of the scanning distortion in tabular form (FIG. 14).

SECOND EMBODIMENT

Figure 13:
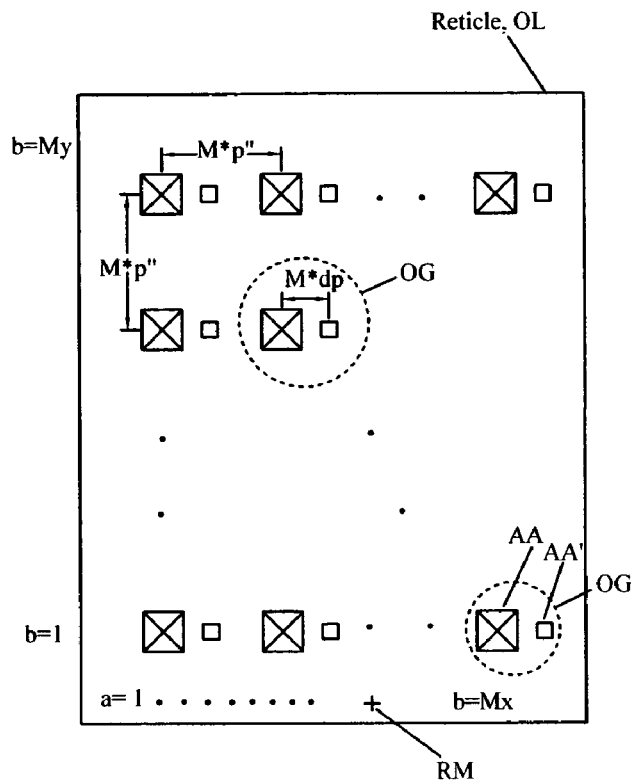
FIG. 13 shows a second embodiment of the preferred reticle.
Figure 21:
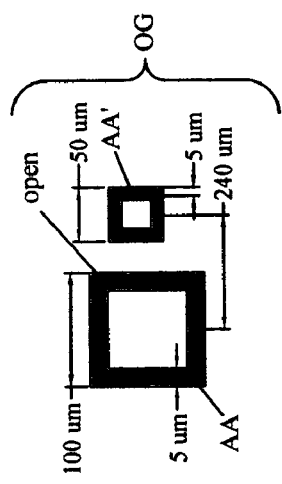
FIG. 21 shows an example of a minimal overlay group as realized on a dark field reticle for carrying out the method of this invention.
Figure 22:
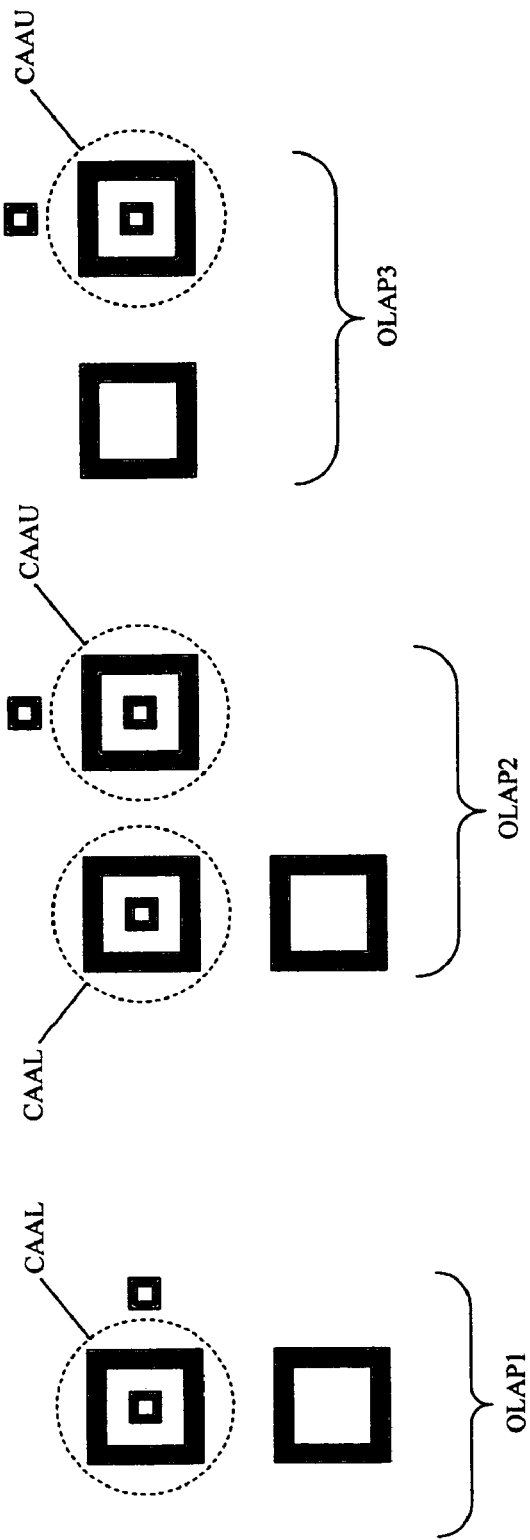
FIG. 22 shows overlapped overlay groups OLAP1, OLAP2, OLAP3 as realized with the overlay group of FIG. 21.

Instead of the reticle of FIG. 6, this invention could be carried out with the reticle layout of FIG. 13. It too consists of an Mx×My array of overlay groups OG on regular pitch M*p" the only difference being in the details of the overlay group. Now overlay group OG consists of alignment attribute AA and only a single complementary alignment attribute, AA', offset from it in a single direction. An example of an overlay group with this structure is shown in FIG. 21. There a dark field reticle design consists of outer bar alignment attribute AA and the complementary alignment attribute consists of an inner bar alignment attribute AA'. Reticle dimensions suitable for an M=4 or 5 reduction imaging lithography tool are shown. FIG. 22 shows how projected overlapped overlay groups OLAP1, OLAP2 and OLAP3 of FIG. 18 would appear when the overlay group of FIG. 21 is utilized. Lower, CAAL, and upper, CAAU, completed alignment attributes are also indicated. The dark areas correspond to exposed resist. Other than the appearance of the overlay groups, this reticle would be used in the same way as the reticle mentioned in the preferred embodiment.

THIRD EMBODIMENT

Figure 23:
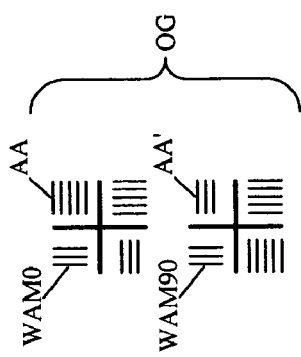
FIG. 23 shows an overlay group OG consisting of a pair of wafer alignment marks.
Figure 24:
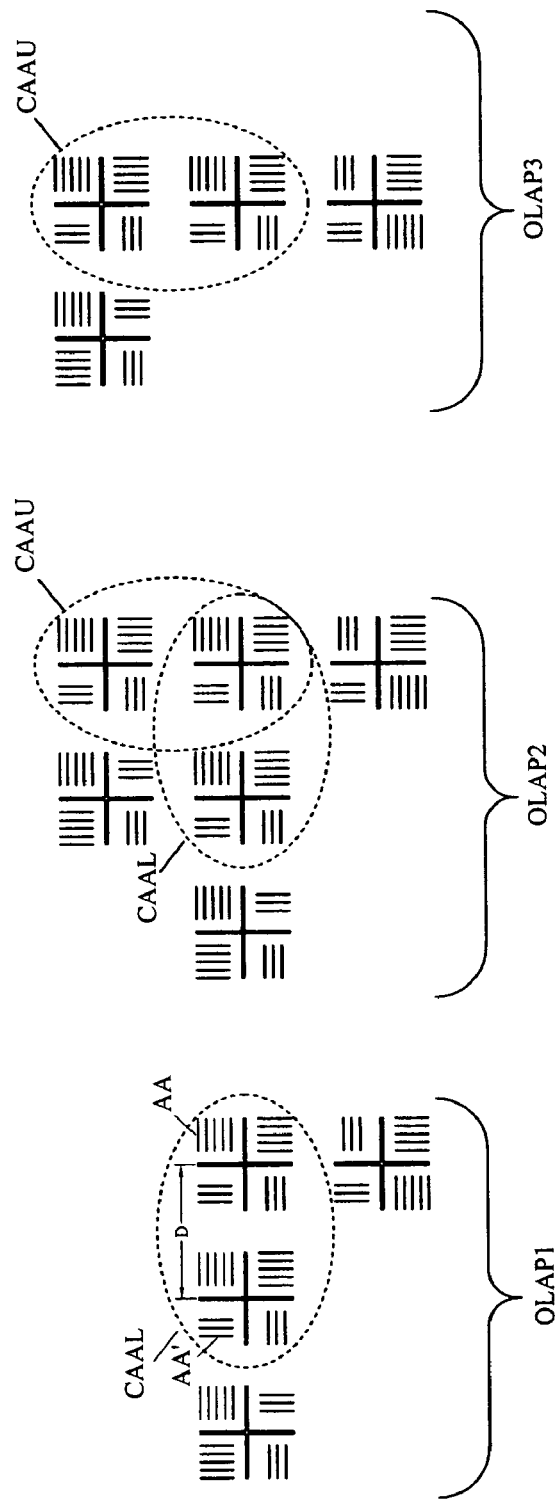
FIG. 24 shows overlapped overlay groups OLAP1, OLAP2, OLPA3 as realized with the overlay group of FIG. 23.

In this case, the overlay groups OG of reticle OL (FIG. 6) consist of a pair of wafer alignment marks. Referring to FIG. 23, overlay group OG consists of alignment attribute AA and offset from it is complementary alignment attribute AA'. AA is a wafer alignment mark, WAM0, suitable for use by a lithography tool wafer alignment system and stage when the wafer is in the nominal or 0 degree position. AA' is a wafer alignment mark, WAM90, which is wafer alignment mark WAM0 rotated by 90 degrees in a clockwise direction. FIG. 24 shows how projected overlapped overlay groups OLAP1, OLAP2 and OLAP3 of FIG. 18 would appear when the overlay group of FIG. 23 is utilized. Lower, CAAL, and upper, CAAU, completed alignment attributes are also indicated. The exposure steps of the preferred embodiment must be altered is an obvious way so the wafer pattern results in the projected overlapped overlay groups OLAP1, OLAP2 and OLAP3 of FIG. 24. The other step that differs in detail is that of measuring the overlay targets. In this instance, instead of using an optical overlay metrology tool, the lithography tool wafer stage and alignment system is used. The completed alignment attribute is a pair of wafer alignment marks (FIG. 3 and CAAL, CAAU of FIG. 24) and the lithography system measures the offset of the two alignment marks AA' and AA and the nominal offset, (D,0), is subtracted from this resulting in the required overlay measurement. The nominal offset, (D,0), is determined by the details of the exposure plan and the minimum separation requirements of the wafer alignment system. Typically, D is less than about 0.5-1 mm so that the wafer stage is utilized over extremely small distances where it's accuracy will be greatest. So, when referring to overlay metrology tools, we also encompass absolute positioning metrology tools used over small (<4 mm) distances. Wafer alignment mark WAM need not be the same wafer alignment mark as the machine we are measuring, it could be another absolute positioning metrology tool. This embodiment is useful for embedding the entire procedure and technique of this invention into a lithography tool for self-analysis.

FOURHT EMBODIMENT

Figure 25:
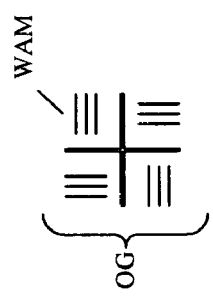
FIG. 25 shows an exemplary overlay group consisting of a single wafer alignment mark.
Figure 26:
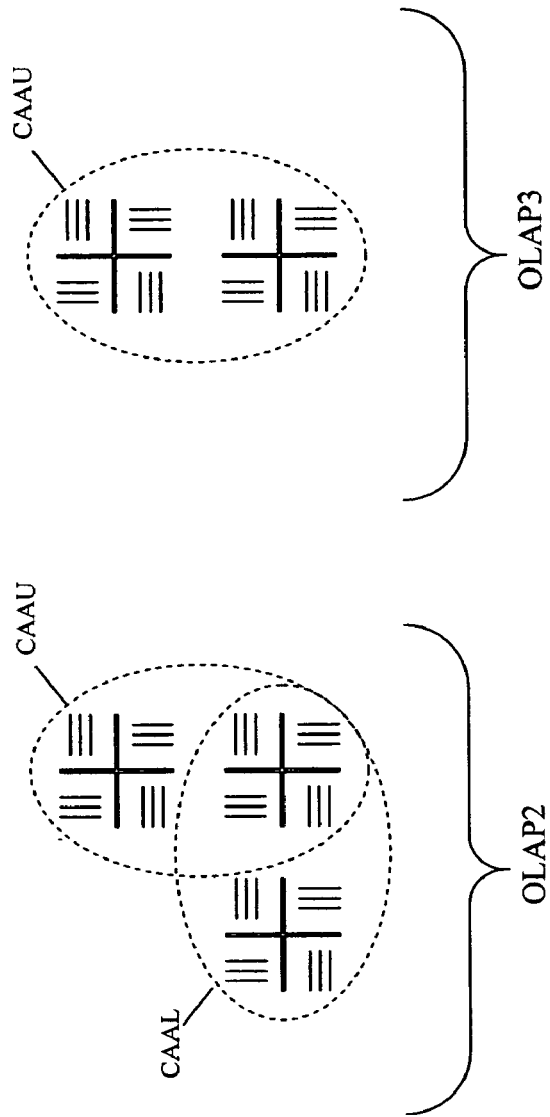
FIG. 26 shows overlapped overlay groups OLAP1, OLAP2, OLAP3 as realized with the overlay group of FIG. 25.
Figure 32:
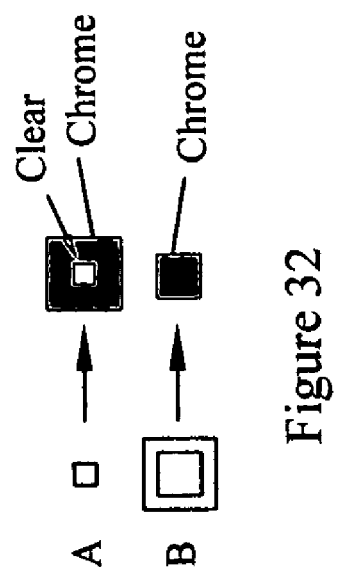
FIG. 32 explains the schematics used in FIG. 2.
Figure 33:
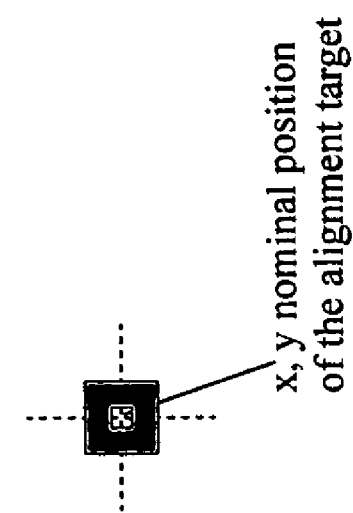
FIG. 33 shows a perfectly overlaid box in box structure.
Figure 31:
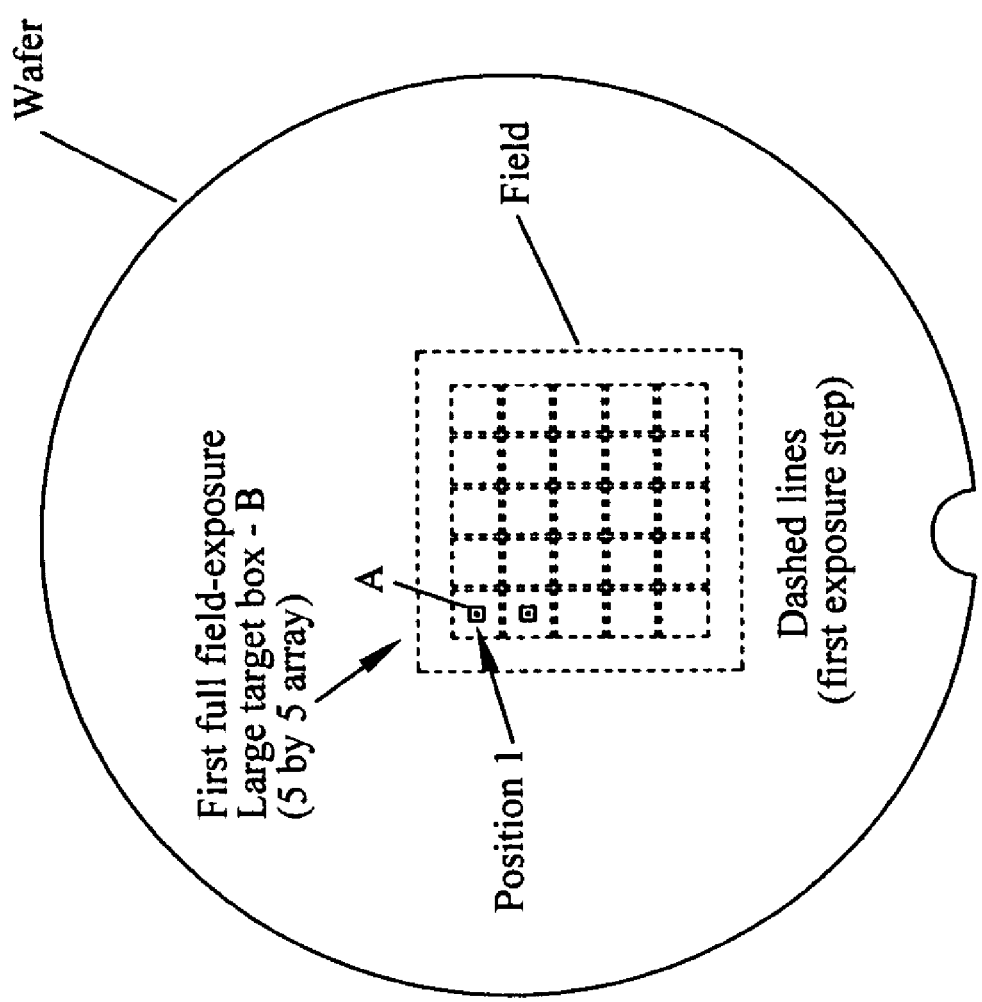
FIG. 31 shows an example of a prior art lens distortion test exposure pattern.

In this case, the overlay groups OG of reticle OL (FIG. 6) consists of a single wafer alignment mark. Referring to FIG. 25, overlay group OG consists of alignment attribute AA which is complementary to itself when rotated by 90 degrees. WAM is a wafer alignment mark suitable for use by a lithography tool wafer alignment system. FIG. 26 shows how projected overlapped overlay groups OLAP1, OLAP2 and OLAP3 of FIG. 18 would appear when the overlay group of FIG. 25 is utilized. Lower, CAAL, and upper, CAAU, completed alignment attributes are also indicated. The exposure steps of the preferred embodiment must be altered is an obvious way so the wafer pattern results in the projected overlapped overlay groups OLAP1, OLAP2 and OLAP3 of FIG. 26. The detailed method and description of measuring the completed alignment attributes is as described in the third embodiment. This embodiment is extremely useful when the procedure and technique is embedded into the projection imaging tool for use in self-analysis.

FIFTH EMBODIMENT

FIG. 28 shows a fifth embodiment constructed in accordance with this invention. When it is desired to measure the repeatable part of the dynamic scan distortion with a minimum number of overlay measurements, the two reticles are used. The first reticle, OL, is the one already described above. The second reticle, OL', is the reticle of FIG. 6 as modified with the addition of a partially reflecting coating, PR, to the surface opposite the patterned chrome surface (FIG. 28). There, partially reflecting coating PR will typically reflect 50% to 99% of the incident light used for resist exposure while patterned chrome surface, PS, contains overlay groups OG. Thus, overlay reticle OL' is a reduced transmission reticle, meaning it's transmission is less than that of a normal reticle. In operation, the step of "Expose Reticle" which produces field F of FIG. 17 is carried out with reticle OL'. Now instead of a single exposure, because of the reduced net reticle transmission (as produced by partially reflecting coating PR), multiple exposures are made so the resist receives the correct clearing dose. The effect of doing N exposures to make field F is that the non-repeatable part of the dynamic scan distortion is averaged over a number of exposures proportional to N thereby reducing its contribution to the net dynamic scan distortion. After the "Expose Reticle" step has been carried out, the remaining steps, as previously described, are carried out. In particular, the step of "Expose OL Reticle to Create Completed Alignment Attributes" is carried out using ordinary reticle OL.

SIXTH EMBODIMENT

FIG. 29 shows a sixth embodiment constructed in accordance with this invention. This is another specific variation of the reduced transmission reticle, OL', of the fifth embodiment only now instead of having a partially reflecting coating on the back side, the patterned face that contains the overlay groups, OG, is patterned as an attenuated phase shift mask. See The Attenuated Phase Shift Mask, B. Lin, Solid State Technology, Special Series/Advanced Lithography, 35(1):43-47, (January, 1992). The overlay groups are patterned using only the attenuated phase shifting material. It is not the phase shifting property of this layer that is significant only its transmission characteristics which are typically less than about 10%. In all other respects, this embodiment is identical to the fifth embodiment.

SEVENTH EMBODIMENT

FIG. 30 shows a seventh embodiment constructed in accordance with this invention. Here instead of reticle OL of FIG. 6 being a transmissive reticle it is a reflective reticle. In a dark field version of this (FIG. 30) the overlay groups are defined by the presence of a reflective layer on the mask.

Embodiments for Determining Wafer Stage Grid and Yaw for Individual Scans

Wafer stage grid and yaw is an important source of overlay error (see A. Smith et al., "Method and Apparatus for Self-Referenced Wafer Stage Positional Error Mapping", U.S. Pat. No. 6,734,971, May 11, 2004). Wafer stage grid and yaw refer to the overlay error contributed by the wafer stage in translation (tx,ty) and rotation (q) in moving from one projection field to another; and is commonly referred to as wafer stage error. Self-referenced techniques for measuring the repeatable part of it on scanners are described in "Method and Apparatus for Self-Referenced Wafer Stage Positional Error Mapping", supra. These techniques can be used to determine the average or repeatable behavior of stage grid and yaw which is an important component of the error because it can be corrected for either internally within the scanner or using production job decks that are customized to particular machines by incorporating known wafer stage errors.

Statistical analysis and correlations of wafer stage grid and yaw are valuable, for example, for machine trouble shooting, machine classification and machine emulation (see A. Smith et al., "Method of Emulation of Lithographic Projection Tools", U.S. application Ser. No. 11/111,302, Apr. 20, 2005 claiming priority to U.S. Provisional Patent Application No. 60/564,094, Apr. 20, 2004). The ability to measure the wafer stage error for individual scans improves the gathering and compiling of meaningful statistics. Thus, it would be desirable to have a self-referenced technique that can determine the wafer stage grid and yaw for individual scans on a step and scan projection lithography tool.

Figure 35:
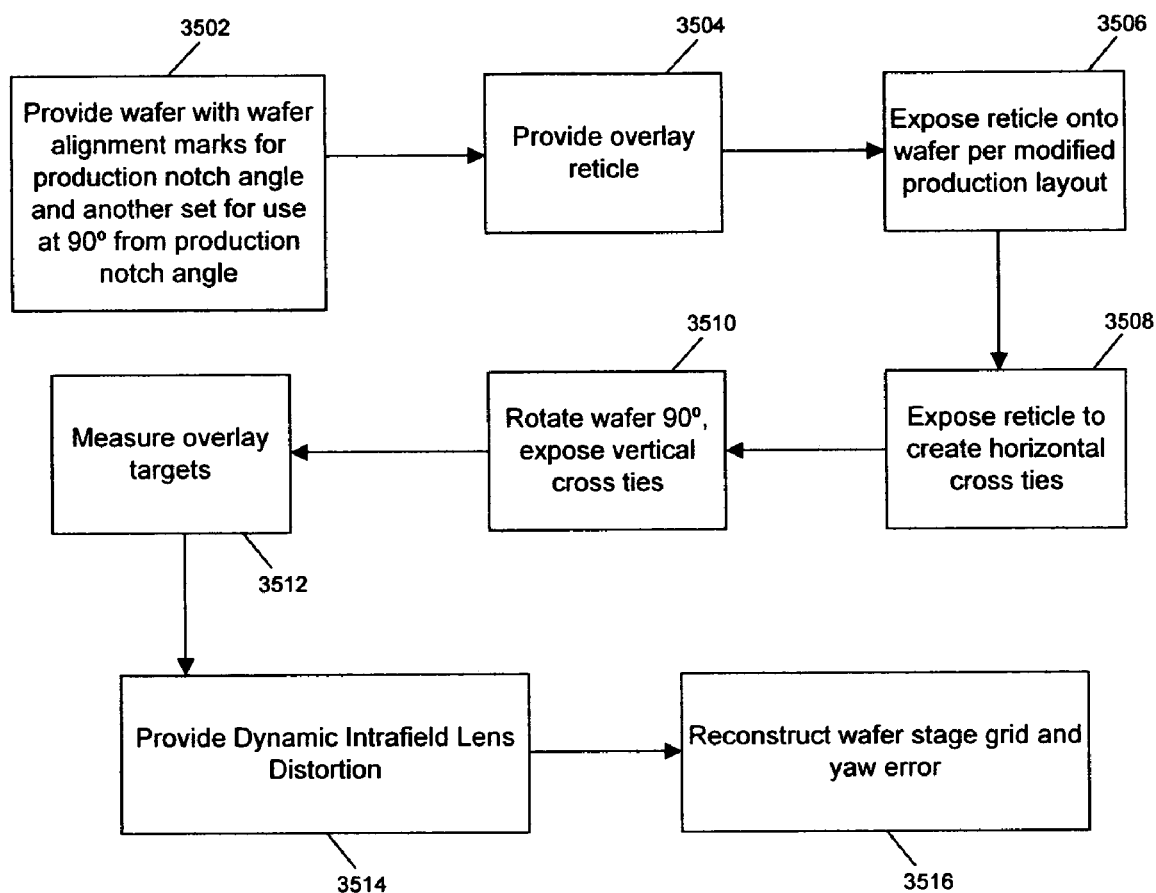
FIG. 35 is a flow chart illustrating a technique for measurement of wafer stage grid and yaw errors when operating in dynamic mode.

FIG. 35 is a flow chart illustrating a technique for measurement of wafer stage grid and yaw errors. Flow begins in Block 3502 where a wafer is provided. The wafer includes two sets of alignment marks, one set for production notch angle, and another set for use at 90 degrees from the production angle. Flow continues to Block 3504 where an overlay reticle is provided. Flow continues to Block 3506.

In Block 3506 the reticle is exposed onto the wafer in accordance with a modified production layout scheme. Flow continues to Block 3508 where the reticle is exposed to create horizontal cross ties. Flow continues to Block 3510. In Block 3510 the wafer is rotated 90°. The reticle is exposed to create vertical cross ties. Flow continues to Block 3512.

In Block 3512 the exposed overlay targets are measured for location. Flow continues to Block 3514 where dynamic intra-field lens distortion is provided using the overlay target measurements. Flow continues to Block 3516 where a wafer stage grid and yaw error are reconstructed.

Figure 36:
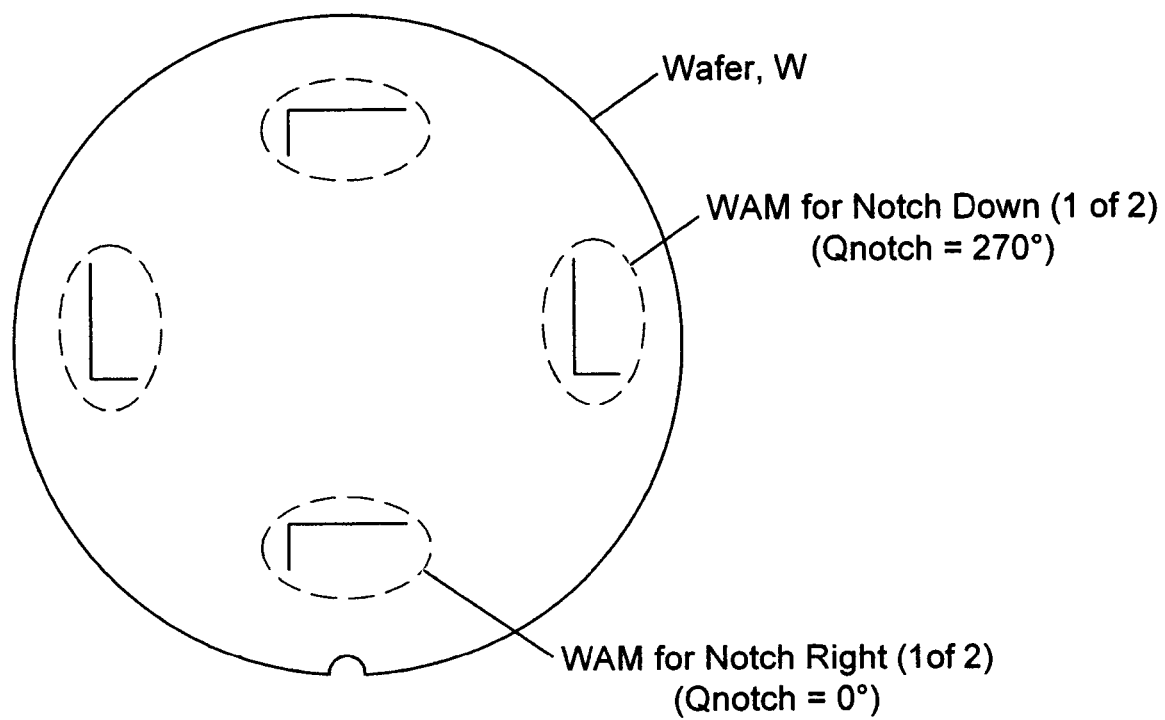
FIG. 36 is a schematic illustrating a wafer with wafer alignment marks suitable for alignment at two notch angles offset by 90 degrees from each other.

FIG. 36 is a schematic illustrating a wafer with wafer alignment marks suitable for alignment at two notch angles offset by 90 degrees from each other as described in Block 3502 of FIG. 35. As shown in FIG. 36, one set of wafer alignment marks (WAMs) is used for wafer alignment with the wafer in notch down (Qnotch=270°) position. The other set of WAMs is used when the wafer is rotated by 90 degrees (Qnotch=0°) The WAMs are typically etched into the wafer W.

Figure 37:
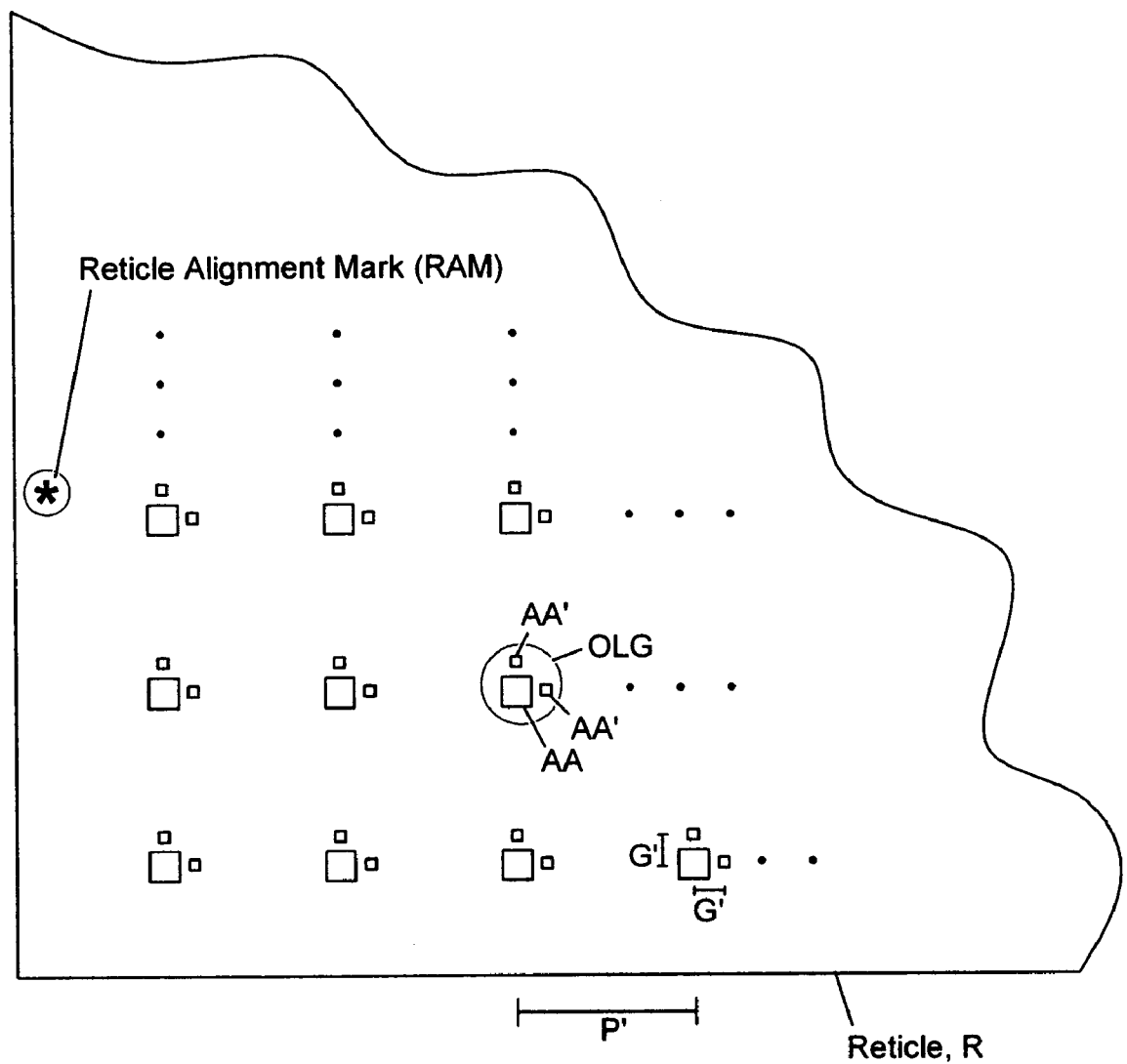
FIG. 37 is a plan view of a portion of a reticle illustrating sets of overlay groups (OLG).

FIG. 37 is a plan view of a portion of a reticle, as could be used in Block 3504 of FIG. 35, illustrating sets of overlay groups (OLG). As shown in FIG. 37, a portion of the reticle R includes an NRX×NRY set of overlay groups, OLG, on a pitch P'. The reticle illustrated in FIG. 37 is similar to that described in A. Smith et al., "Method and Apparatus for Self-Referenced Projection Lens Distortion Mapping", U.S. Pat. No. 6,573,986, Jun. 2, 2003.

Figure 38:
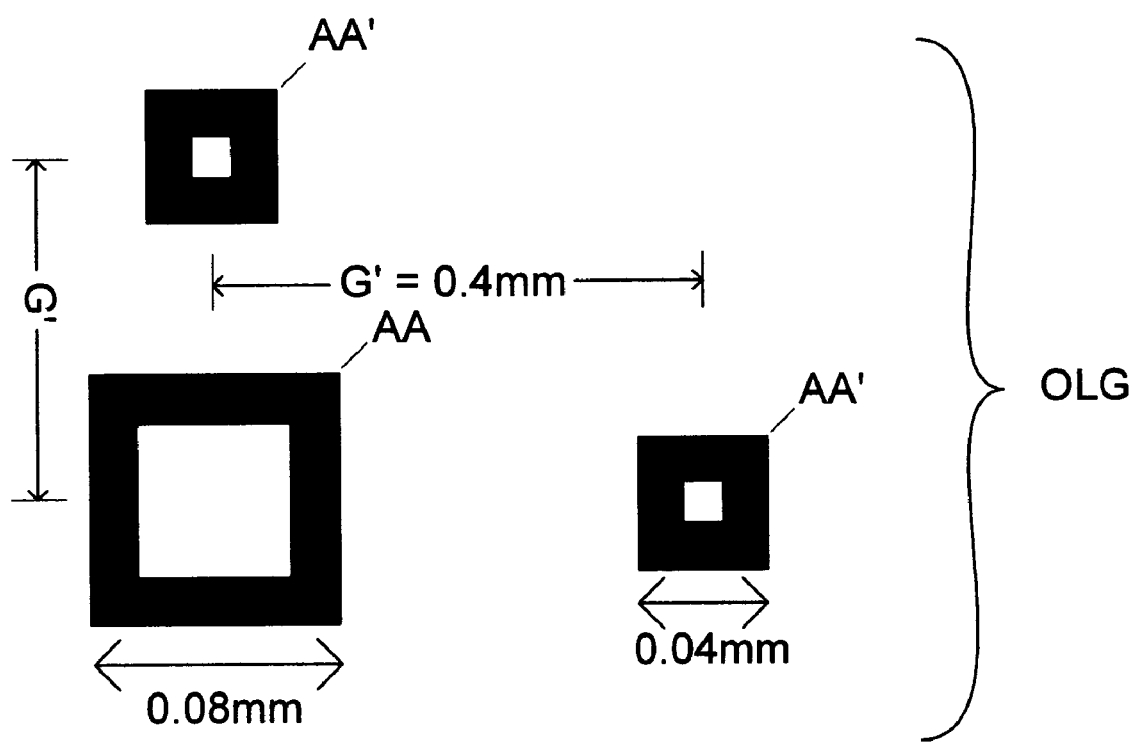
FIG. 38 is a schematic illustrating further details of an overlay alignment group.

FIG. 38 is a schematic illustrating further details of an exemplary overlay alignment group. In the exemplary OLG shown in FIG. 38, the overlay group OLG is written on a dark field mask where an alignment attribute (AA) is an outer bar pattern and complimentary alignment attributes (AA') are an inner bar pattern. When the AA is printed on the wafer W the resulting structure is referred to as a printed alignment attribute (PAA). Likewise, when the AA' is printed it is referred to as a printed complimentary alignment attribute (PAA'). The result of overlaying an AA and a AA' results in a completed alignment attribute (CAA) as discussed further in FIG. 39. The CAA is a structure that can be read by an overlay metrology tool.

Figure 39:
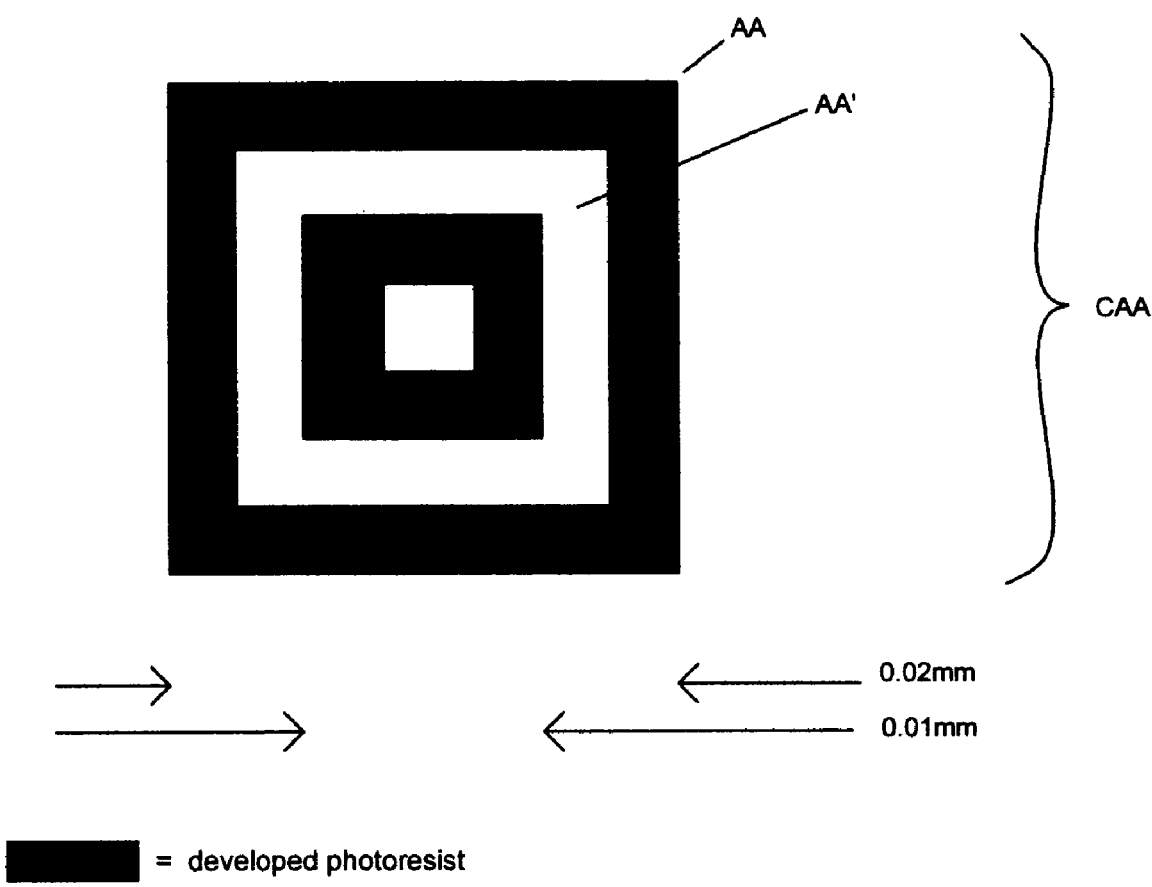
FIG. 39 is a plan view of a completed alignment attribute.

FIG. 39 is a plan view of an exemplary completed alignment attribute printed at M=4 reduction. As shown in the example of FIG. 39 the CAA is made up of an AA that is an outer bar, or box, with an AA' that is an inner bar, or box, located inside the AA outer bar. The resulting structure illustrated in FIG. 39 is referred to as a bar-in-bar pattern and the relative positions of the AA and AA' can be read by an overlay metrology tool, such as, a KLA 5200 or other commercial tool. FIG. 39 illustrates an example of why features AA and AA' on a reticle are referred to as being complementary to one another because the CAA can be read by an overlay tool.

Returning to FIG. 36, the wafer W may be coated with photoresist and loaded onto a scanner projection imaging tool (PIT) described in FIG. 47 below. The overlay reticle R is exposed with a field size, dose, and field layout that mimics the product layout, as described in Block 3506 in FIG. 35, above. An advantage for duplicating production runs in as many aspects as possible is that it replicates stage exposure dynamics as product wafers experience it. A production field pattern is generally a rectangular grid of field centers (most common) or the fields are shifted from row to row (or possibly from column to column) by some multiple of the die pitch. This shifting is typically done to try to maximize the number of good die. The location of the center of the production fields on the wafer (wafer center=0,0) is (XCP, YCP) (IP=1:NF) and the projected field widths are (XWP, YWP). A modification made for the overlay reticle R exposure sequence is to snap its exposure centers to a grid with the same pitch as the projected overlay group pitch P=P'/M. Thus, the locations of the field centers on the wafer will be:

$$(XC, YC)(IP) = P * \left( NINT\left(\frac{XWP(IP)}{P}\right), NINT\left(\frac{XWP(IP)}{P}\right) \right) \quad \text{Equation 32}$$

where:

NINT=nearest integer function and the exposure width will be reduced slightly so that no partial overlay groups are exposed:

$$(XW, YW) = 2 * P * \left( INT\left(\frac{XWP}{2} * P\right), INT\left(\frac{XWP}{2} * P\right) + 4 * G \right) \quad \text{Equation 33}$$

$$\text{where: } G = \frac{G'}{M} \quad \text{Equation 34}$$

This technique results in putting down a regular grid (possibly with missing rows and columns) of printed overlay groups with a pitch=P.

Figure 40:
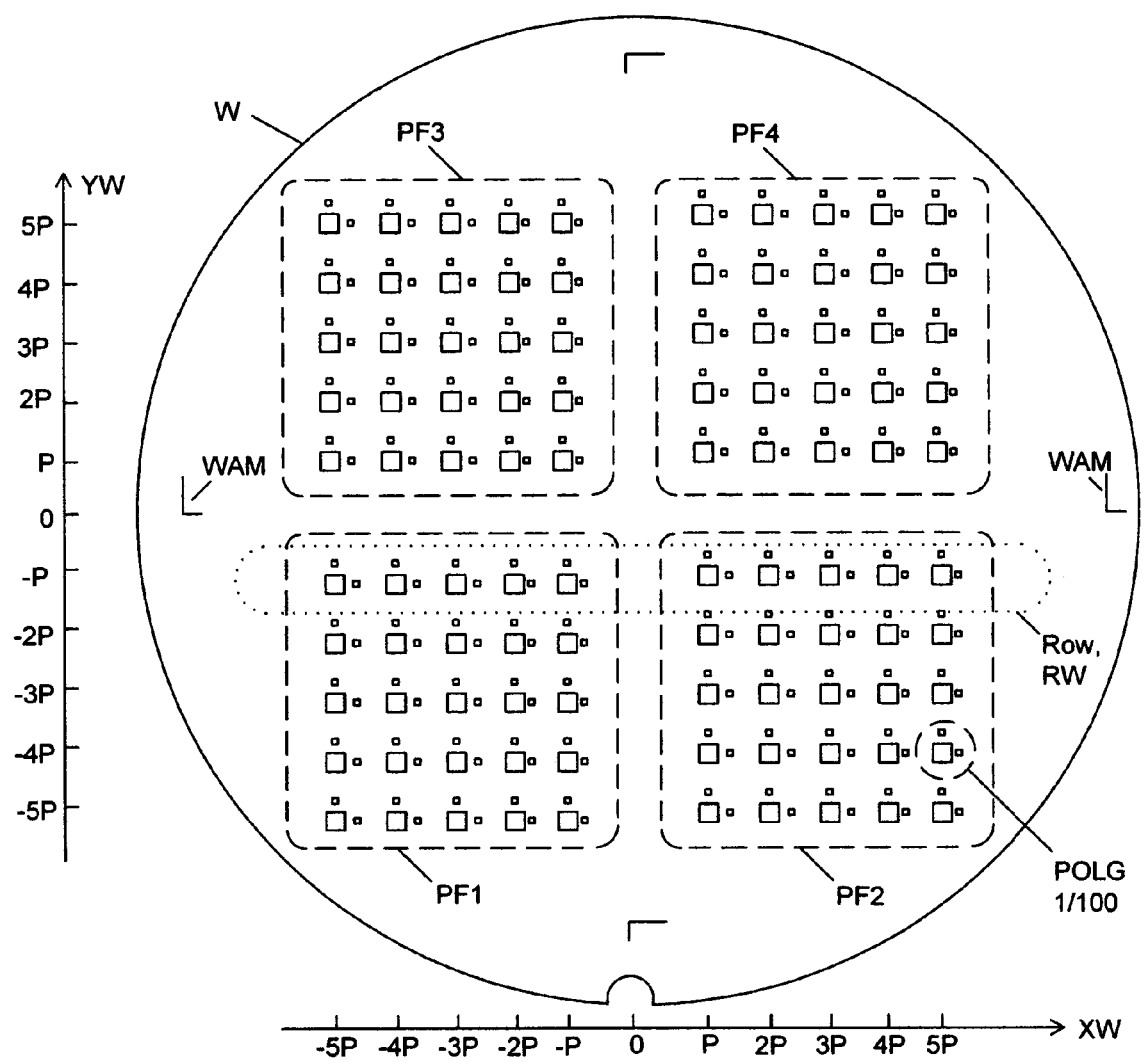
FIG. 40 is a schematic illustrating a wafer after exposure of an overlay reticle according to modified production plan layout.

FIG. 40 is a schematic illustrating a wafer after exposure of an overlay reticle according to a modified production plan layout. FIG. 40 shows wafer W after printing overlay reticle R four times resulting in printed fields PF1:PF4. The resulting printed overlay groups, POLG, are located on a two-dimensional grid of pitch P with a missing column at XW=0 and a missing row at YW=0. Wafer alignment marks WAM were used to print this wafer in the notch down (Qnotch=0°) orientation. The wafer stage translation and rotation present in the fields printed in this exposure step (PF1:PF4 in FIG. 40) will be determined.

The overlay reticle R is now exposed to create so-called horizontal cross ties or HCT, as described in Block 3508 in FIG. 35, above. Because the overlay reticle R was printed so that overlay groups OLG are on regular pitch P, additional exposures can be performed such that each row of the printed overlay groups from the modified production exposure, described above, has adjacent printed fields, PF, tied together at a minimum of two sites in each printed field per adjacent printed field. For example, in FIG. 40, row RW located at YW=-P contains POLG from printed fields PF1 and PF2.

Figure 41:
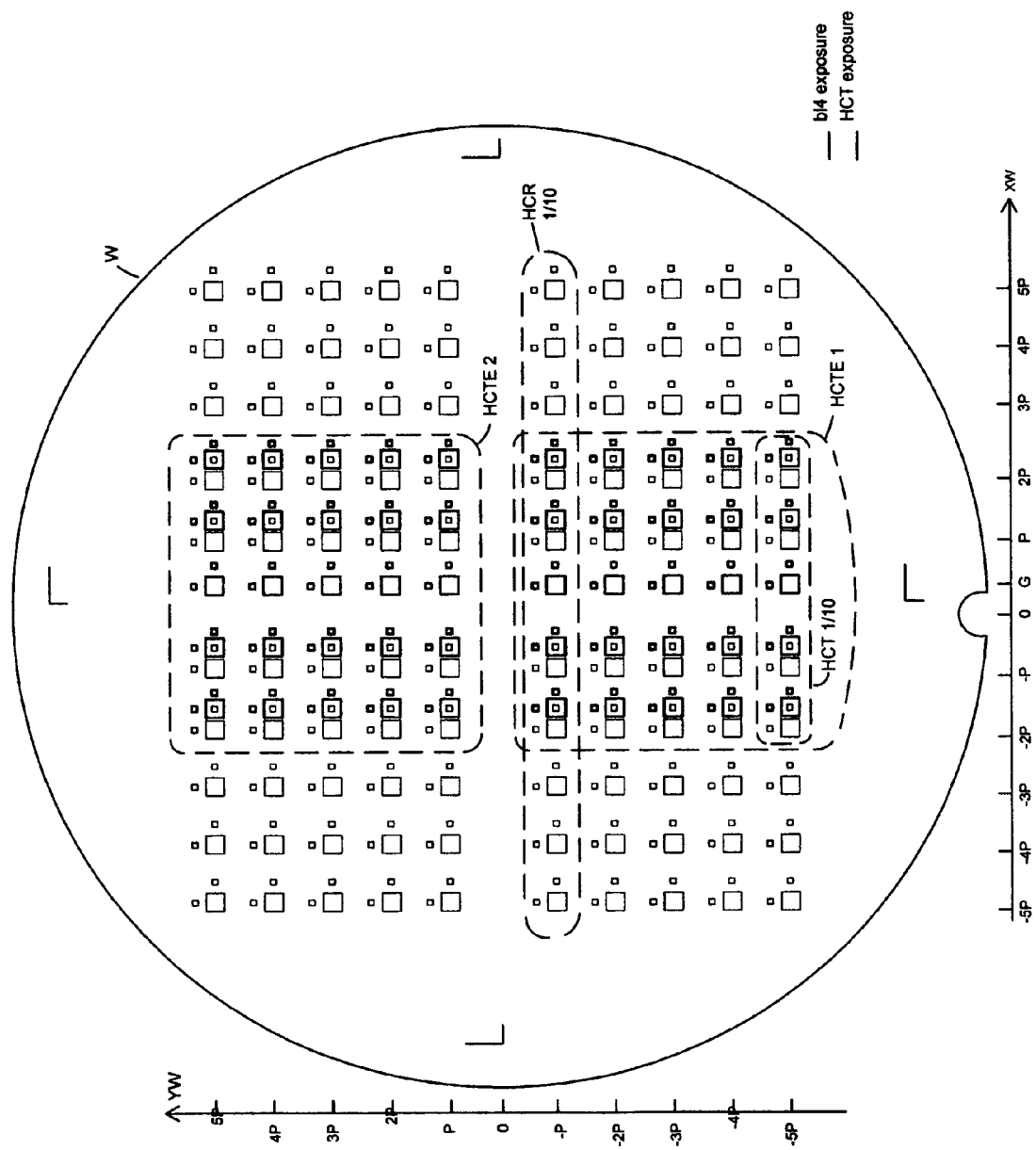
FIG. 41 is a schematic illustrating a wafer after exposure of horizontal cross ties.

FIG. 41 shows the first horizontal cross tie exposure (HCTE1) which places the field center of a 5×5 central section of overlay reticle R at wafer coordinates (XW,YW) =(G, -3P) and creates horizontal cross ties for rows 1:5 (i.e., rows with YW=-5P, -4P, -3P, -2P, -P). The next HCT exposure, HCTE2, creates the horizontal cross ties for rows at YW=P:5P. This would complete the HCT exposures for the wafer of FIG. 41. There are a total of ten HCT in FIG. 41 of which one, HCT 1/10, is explicitly called out. It overlaps two POLG in PF1 (POLG located at XW=-2P, -P) and two POLG in PF2 (POLG located at XW=P, 2P). In general, each HCT exposure will overlap two adjacent printed fields and within each adjacent field it will need to overlap a minimum of two POLG (more are better, vide infra).

Figure 42:
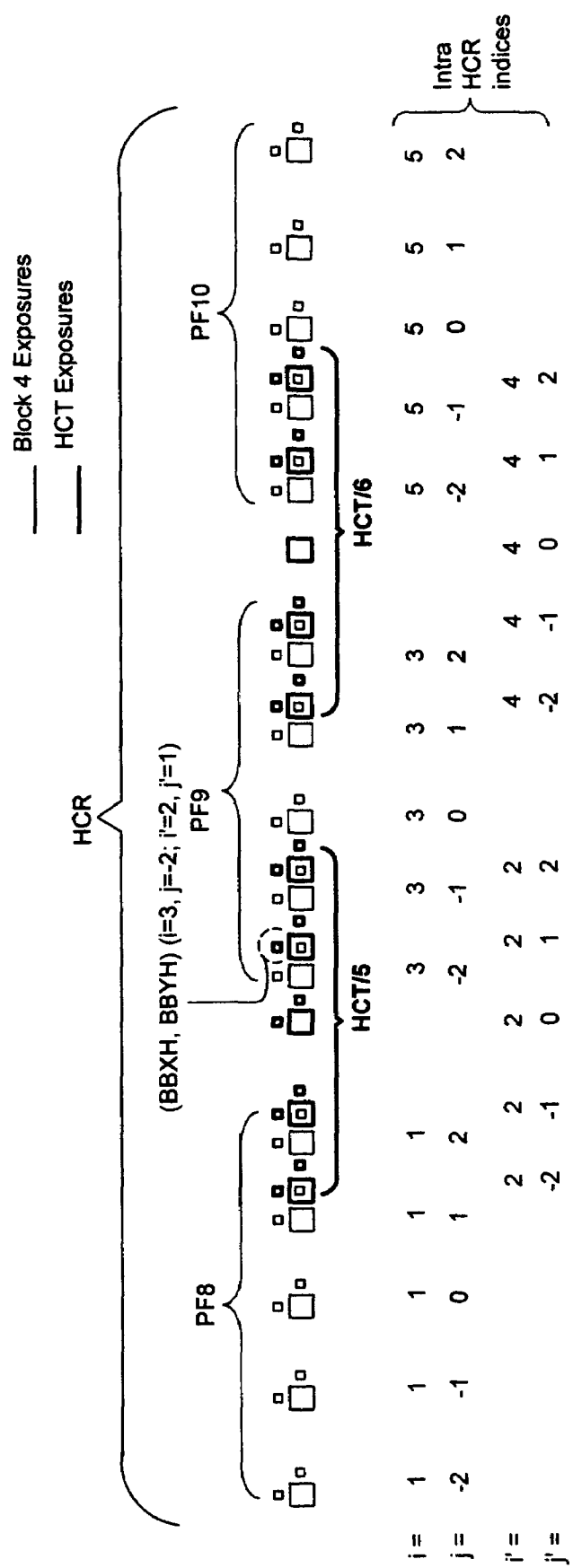
FIG. 42 is a schematic illustrating further detail of a horizontal cross row.

After exposing the HCT, each row of printed fields form a horizontal cross row, HCR, of which one (HCR 1/10) is shown in FIG. 41 surrounded by a dashed line. Another example is shown in FIG. 42 where portions of three printed fields, PF8, PF9, PF10, are tied together by two HCT exposures (HCT15, HCT16) to form horizontal cross row HCR.

Two exposures were made to create the HCT in FIG. 41; this was for economy in stepper setup. Likewise, ten separate exposures could have been performed, one for each HCT in FIG. 41.

Rotate Wafer 90°. Expose Vertical Cross Ties

Figure 43:
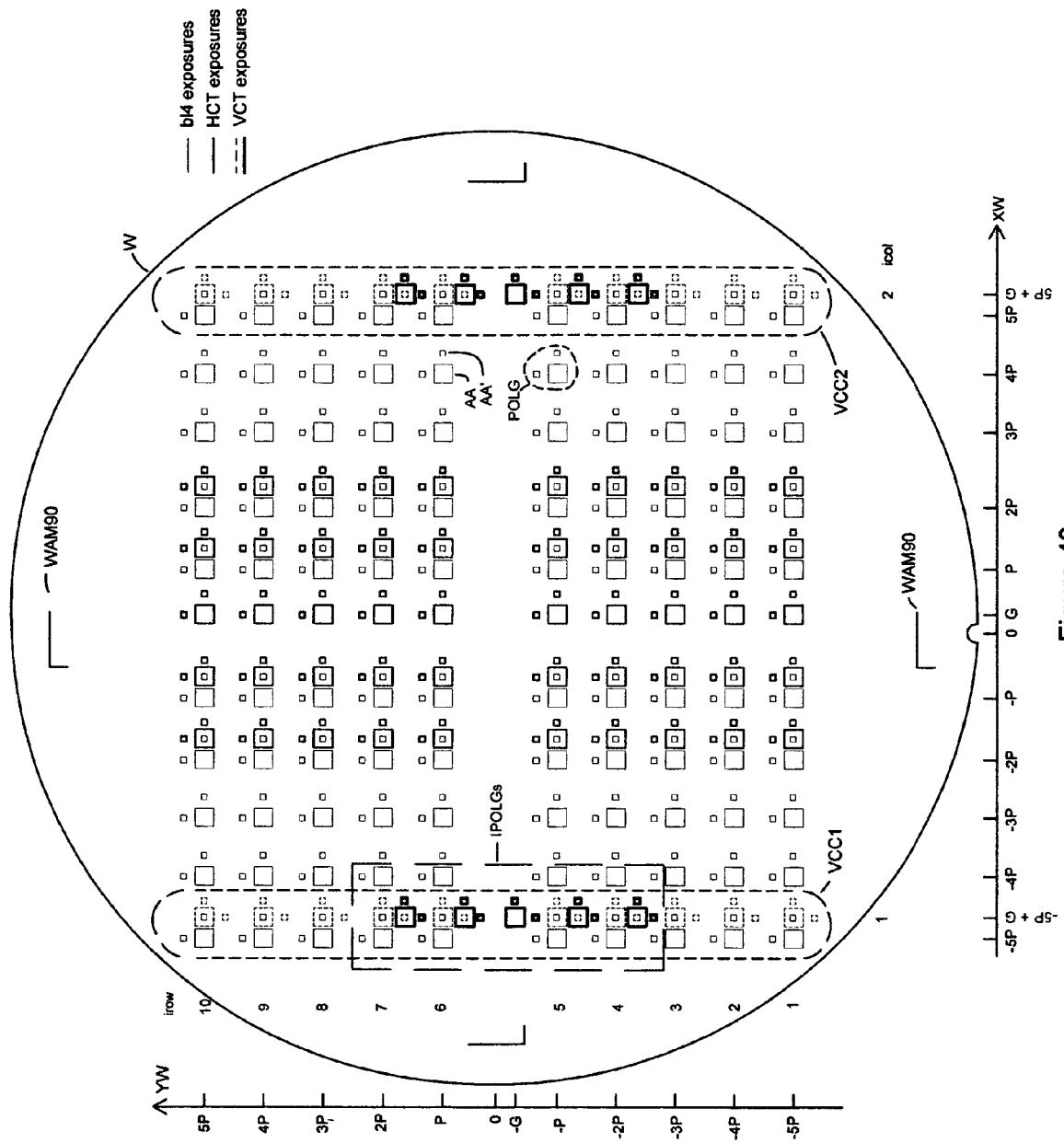
FIG. 43 is a schematic illustrating a wafer after exposure of vertical cross ties.

As described in Block 3510 in FIG. 35, after the horizontal cross ties have been created, the wafer W may be rotated 90 degrees and aligned to wafer alignment marks WAM90 (see FIG. 43). After alignment, vertical cross ties, VCT, are exposed to create two or more vertical cross columns (VCC1 & VCC2). FIG. 43 is a schematic illustrating a wafer after exposure of vertical cross ties. In FIG. 43, the VCT exposures are indicated by dashed and bold gray overlay groups and by themselves (that is without considering the POLG created in Block 3506 in FIG. 35) form structures that are analogous to the HCR of FIG. 41, but rotated by 90°. In illustration, rotating FIG. 43 by 90 degrees counter clockwise and looking only at the dashed and bold gray POLGs, there is a structure similar to HCR1/10 of FIG. 41. Thus, each VCC forms an interlocked line with an overlap of at least two POLG per scan row exposure. For the example shown in FIG. 43, VCC1 is made by three separate VCT exposures, where one of the exposures (shown in bold gray) forms interlocking POLGs (IPOLGs) joining PF1 with PF3.

As shown in FIG. 43, each VCC also overlaps every POLG printed during the modified production plan layout (see Block 3506 of FIG. 35) within the VCC's column. Referring again to FIG. 43, printed complimentary alignment attributes, PCAA, in VCC2 overlap all of the printed alignment attributes (PAA) that are offset from the PCAA in the XW=5P column laid down in Block 3506 in FIG. 35. Observe the same arrangement in VCC1 of FIG. 43.

Generally, two VCCs will be adequate in determining wafer stage grid and yaw, however a greater number may lead to better results by providing redundancy that will increase the accuracy of the described techniques.

Figure 44:
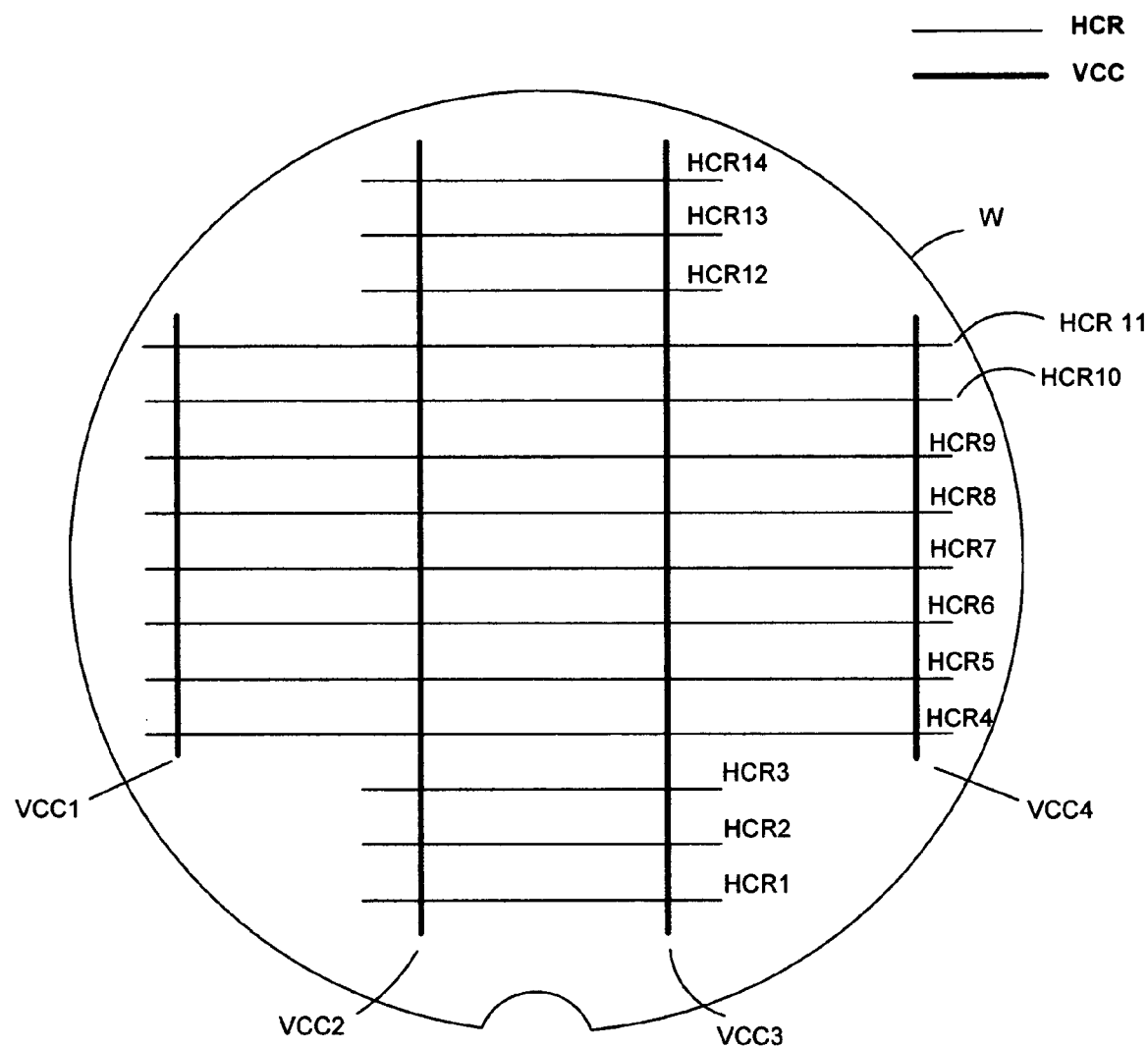
FIG. 44 is a schematic illustrating a layout of horizontal cross rows (HCR) and vertical cross columns (VCC) on a wafer.

FIG. 44 is a schematic illustrating a layout of horizontal cross rows (HCR) and vertical cross columns (VCC) on a wafer. As illustrated in FIG. 44, if there are horizontal cross rows, for example, HCR1:HCR14, then only two vertical cross columns VCC2 and VCC3, would be needed to obtain adequate results. However, including additional vertical cross columns VCC1 and VCC4 increases the accuracy of the resulting reconstruction.

After exposure of horizontal and vertical cross ties, overlay measurements are taken using an overlay metrology tool, such as an Accent Q300 or KLA 5200. The measurements may be conveniently first divided up into HCR and VCC sets.

The HCR sets may be indexed by the row number (irow in FIG. 43), cross scan row index (i and i'in FIG. 42) and transverse overlay group index within the scan row (j and j' in FIG. 42). This organization is based on the observation that while the reticle and intra-field lens distortion errors (vide infra) are known, the remaining unknowns are the scan synchronization error combined with the wafer stage grid and yaw and, therefore, each individual scan row (ISR) has a known position to within a translation and rotation. The HCR overlay may be taken and presented as a five fold indexed array (BBXH,BBYH)(irow;i,j;i',j') where:

irow=cross wafer printed field (Block 3506 in FIG. 35) scan row number i=independent scan row (ISR) number within irow of printed field (Block 3506 exposure sequence)

j=overlay group column number within ISR I i'=independent scan row (ISR) number within irow of horizontal cross tie (HCT)

j'=overlay group column number within ISR i'.

An example of measurement at a particular site is illustrated in FIG. 42, where the irow index has been dropped. In FIG. 42, there are a total of eight overlay measurements characterized by constant valued index irow and indices: (i,j;i',j')=(1,1;2,−2), (1,2;2,−1), (3,−2;2,1), (3,−1;2,2), (3,1; 4,−2), (3,2;4,−1), (5,−2;4,1), (5,−1;4,2).

Measurements of VCC may fall into two categories, those used for intra VCC adjustment and inter HCR/VCC adjustment. Intra VCC adjustment is similar to intra HCR adjustment in that the overlay measurements are being used to solve for the individual scan rows (ISR) translation and rotation. Intra VCC measurements are denoted (BBXV, BBYV)(icol;i",j";i''',j''') where the intra VCC indices (icol; i"j";i''', j''') mean:

icol=VCC column number i"=independent scan row (ISR) number within VCC exposure that overlays printed field (see Block 3506 in FIG. 35) exposures j"=overlay group column number within ISR i"

i'''=independent scan row (ISR) number within VCC exposure that only overlays other VCC exposures j'''=overlay group column number within ISR i'''.

Figure 45:
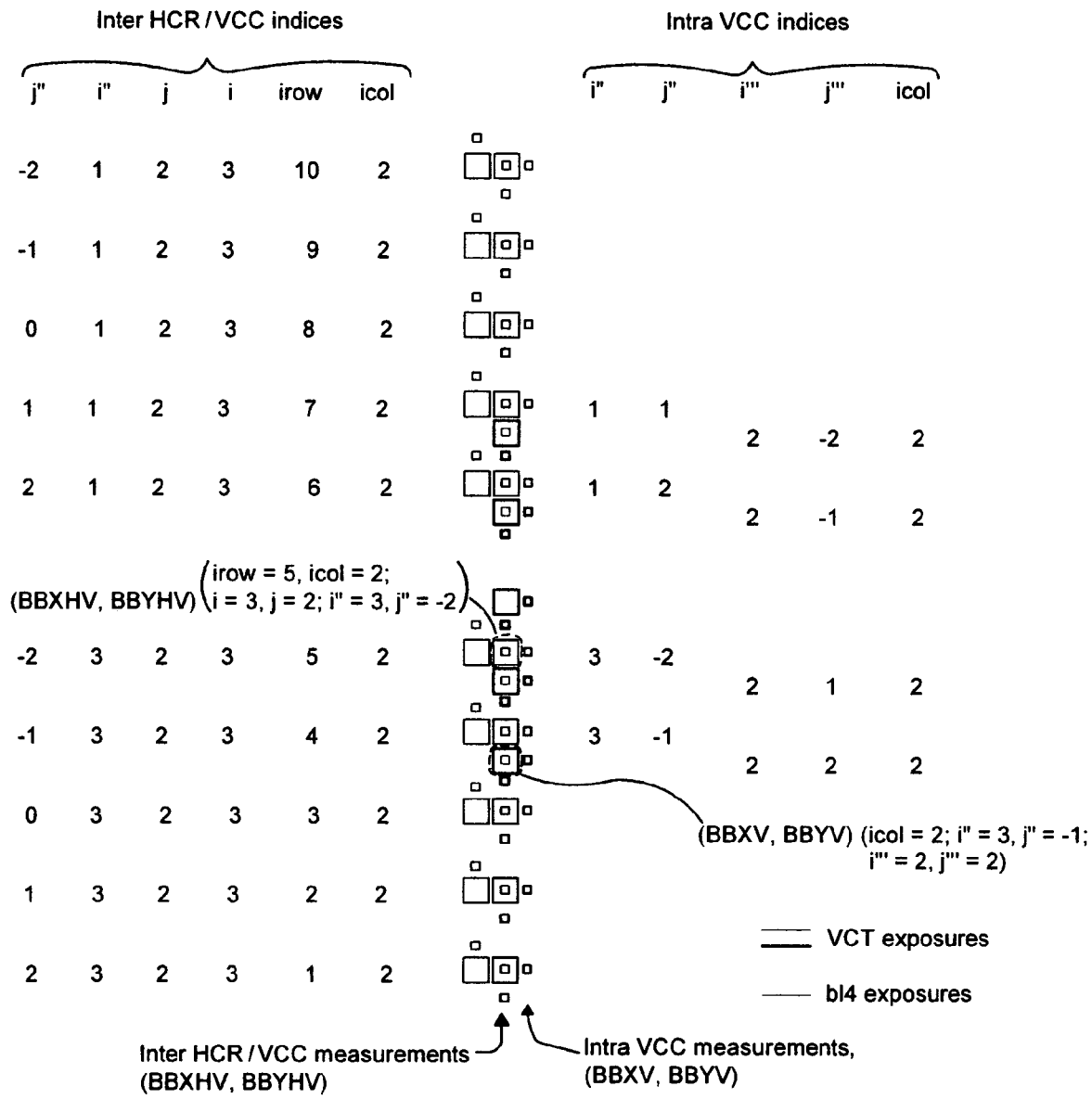
FIG. 45 is a schematic illustrating indices for a vertical cross column used to describe an exemplary technique used to make overlay measurements.

An example for VCC2 of FIG. 43 is shown in FIG. 45. FIG. 45 is a schematic illustrating indices for a vertical cross column used to describe an exemplary technique used to make overlay measurements. In FIG. 45, the indices describing the overlay measurements are:

(icol;i",j";i''',j''')=(2;1,1;2,−2), (2;1,2;2,−1), (2;3;−2;2,1), (2;3,−1;2,2).

A technique referred to as inter HCR/VCC adjustment is the process of adjusting the intra VCC and intra HSR results using the inter HCR/VCC measurements. This technique utilizes the HV overlay measurements (BBXHV,BBYHV) (irow,icol;i,j;i",j") where the indices irow, icol,i,j,i",j"are as defined above. In FIG. 45, the HV overlay measurement indices take on the values (irow,icol;i,j;i",j")=(10,2,3,2,1,−2), (9,2,3,2,1,−1), (8,2,3,2,1,0), (7,2,3,2,1,1), (6,2,3,2,1,2), (5,2,3,2,3,−2), (4,2,3,2,3, −1), (3,2,3,2,3,0), (2,2,3,2,3,1), (1,2,3,2,3,2).

Using the overlay measurements, a dynamic intra-field lens distortion map is supplied (see Block 3514 of FIG. 35). The structure of dynamic intra-field lens distortion is (dxL, dyL)(x); is a function of the field coordinate perpendicular to the scanning direction, i.e., x. A technique for determining intra-field lens distortion is described in A. Smith et al., "Method and Apparatus for Self-Referenced Dynamic Step and Scan Intra-Field Scanning Distortion", U.S. Pat. No. 6,906,303, Sep. 20, 2002, incorporated herein in its entirety. This technique provides the lens distortion to within a translation, rotation and x-scale factor. Preferably, the data is provided within a hierarchical structure as described in "Method of Emulation of Lithographic Projection Tools", supra.

To summarize, first reconstructions of all of the ISRs making up each HCR are made so the position of each POLG within HCR is known to within a translation and rotation common to that row, irow. Next each VCC is reconstructed using only (BBXV,BBYV) overlay data. This process is very similar to HCR reconstruction and the net result is that each VCC column has a known position to within a translation and rotation unique to each column, icol. Finally, the resulting unknown translations and rotations are solved for by combining VCC and HCR reconstructions with (BBXHV, BBYHV) data. All positions are then known (to within ambiguities) and the wafer stage grid and yaw error may be determined.

A model for the combined scan synchronization and wafer stage grid and yaw error for each independent scan row is:

$$(Dx1, Dy1)(irow; i,j) = (tx1(irow,i), ty1(irow,i) + q1(irow, i)*xf(irow;i,j))$$

Equation 35 where:

(tx1(irow,i), ty1(irow,i)) combined wafer stage and scan synchronization error for row irow, column i q1(irow,i)=combined wafer stage and scan synchronization yaw error xf(irow;i,j)=nominal position of overlay mark with respect to center of independent scan row.

The HCR overlay data can then be written as:

$$(BBXH, BBYH)(irow; i, j; i', j') = s(irow; i, j; i', j') *$$
$$[(Dx1, Dy1)(irow; i, j) - (Dx1, Dy1)(irow; i', j') +$$
$$(dxL, dyL)(xf(irow; i, j)) - (dxL, dyL)(xf(irow; i', j')) +$$
$$(dxR, dyR)(xf(irow; i, j), yf(irow; i, j)) -$$
$$(dxR, dyR)(xf(irow; i', j), yf((irow; i', j'))]$$

Equation 36 where:

(xf,yf)(irow;i,j)=nominal y position of overlay mark with respect to center of projected field on the wafer;

(dxR,dyR)(xf,yf)=overlay reticle errors expressed as equivalent offsets at wafer (that is measured reticle error was divided by M) at position within projected field xf, yf; and s(irow;i,j;i',j')=+1/−1 depending on whether (irow;i,j) is an inner box (+1) or outer box (−1), this is of course known from the exposure setup.

Because the sign factor, s, dynamic intra-field lens distortion, (dxL,dyL), and (possibly) reticle error (dxR,dyR) are known, their effect can be removed from Equation 36 by suitable multiplication and subtraction to the measured (BBXH,BBYH) data and we would then get:

$$(BBXHr, BBYHr)(irow; i,j; i',j') = (Dx1, Dy1)(irow; i,j) - (Dx1, Dy1)(irow; i',j')$$

Equation 37 where:

(BBXHr,BBYHr)(irow;i,j;i',j')=transformed (BBXH, BBYH) data.

In the foregoing, this correction is performed on the measured overlay data, so having detailed it, it is assumed to have been done and therefore the r suffix in Equation 37 is dropped to get:

$$(BBXH, BBYH)(irow; i,j; i',j') = (Dx1, Dy1)(irow; i,j) - (Dx1, Dy1)(irow; i',j')$$

Equation 38 where it is understood that the overlay data has been corrected for the sign convention, intra field lens distortion, and (if the data is available) reticle distortion.

Using Equation 35, within HCR row number irow, the ISR translations and rotations are determined by solving the equations:

$$(BBXH, BBYHX)(irow; i,j; i',j') = (tx1(irow,i) - tx1(irow, i')), ty1(irow,i) - ty1(irow,i') + q1(irow,i)*xf(irow;i, j) - q1(irow,i')*xf(irow;i',j')$$

Equation 39

Because there are at least two interlocking printed overlay groups in the HCT exposures Equation 39 can be uniquely solved to within a common translation and rotation. That is, (tx1,ty1,q1) are known to within a common translation and rotation i.e., if: (tx1(irow,i), ty1(irow,i), q1(irow,i))=one specific solution to Equation 39 Equation 40 then we can add to Equation 40 what corresponds geometrically to a translation and net rotation of the row that is a gross translation (constant tx, ty) and a rotation (constant q, ty varies with i only). We denote this ambiguity by:

$$(Tx1, Ty1, Q1)(irow)$$

Equation 41 and uniquely specify our solution (Equation 40) of Equation 41 as having these three parameters set equal to zero.

To summarize, at this point the positions of each feature in each HCR is known to within a translation and rotation that depends only on the row number (Equation 41).

The steps for VCC reconstruction are similar to those for HCR reconstruction except that now we are stitching together a column that consists of a number of independent scan rows (rotate FIG. 43 or 45 by 90°). The error of independent scan rows can be modeled as:

$$(Dx2, Dy2)(icol; i,j) = (tx2(icol,i) - q2(icol,i)*yf2(icol;i,j), ty2(icol,i))$$

Equation 42 where;

(tx2(icol,i), ty2(icol,i))=combined wafer stage and scan synchronization error for VCC column icol, row i;

q2(icol,i)=combined wafer stage and scan synchronization yaw error; and (xf2,yf2)(icol;i,j)=nominal position of overlay mark with respect to center of projected field on the wafer.

In all this, the coordinates are with respect to a notch down or same wafer notch angle used in the exposures described in Block 3506 in FIG. 35. We reduce the box-in-box as in the HCR case (vide supra) and for each VCC we get the set of equations (analog of Equation 33 above):

$$(BBXV, BBYV)(icol; i'', j''', i''', j''') = (tx2(icol, i''') - tx2(icol, i''')) - q2(icol, i'')*yf2(icol; i'', j'') + q2(icol, i''')*yf2(icol; i''', j'''), ty2(icol, i'') - ty2(icol, i''')$$

Equation 43

Again, because there are at least two interlocking POLG in between each ISR, Equation 37 can be solved for each value of icol uniquely to within a term that represents the net translation and rotation of the entire column. This ambiguity is denoted by:

$$(Tx2, Ty2, Q2)(icol)$$

Equation 44 and uniquely specify our solution (Equation 42) of Equation 43 as having these three parameters set equal to zero.

At this point, the unknowns in the determination are represented by the unknown translations and rotations of each HCR (Equation 41) or VCC (Equation 44). The (BBXHV, BBYHV) data can be used to stitch this data together. First, the HV data is reduced to remove sign conventions, intra field lens distortion and, if available, overlay reticle manufacturing error (vide supra). Next, and referring to FIG. 45, the stitch together equations are:

$$(BBXHV)(irow, icol; i, j; i'', j'') = [(Tx1(irow) - Tx2(icol)) - Q1(irow)*(YW1(irow, i, j) - YWC1(irow)) + Q2(icol)*(YW2(icol, i'', j'') - YWC2(icol))] + \{tx1(irow, i) - tx2(icol, i'', j'') - q1(irow, i)* yf(irow, i, j) + q2(icol, i'')*yf2(icol, i'', j'')\}$$

Equation 45

-continued $$(BBYHV)(irow, icol; i, j; i'', j'') = [(Ty1(irow) - Txy2(icol)) - \\ Q1(irow)*(XW1(irow, i, j) - XWC1(irow)) - \\ Q2(icol)*(XW2(icol, i'', j'') - XWC2(icol))] + \\ \{ty1(irow, i) - ty2(icol, i'', j'') + q1(irow, i)* \\ xf(irow, i, j) - q2(icol, i'')*xf2(icol, i'', j'')\}$$ Equation 46 where the new symbols mean:

(XW1,YW1)(irow,i,j)=nominal position on wafer of printed field overlay group (Block 3506 exposure in FIG. 35) in row irow, ISR i, transverse overlay group offset j;

(XW2,YW2)(icol,i",j")=nominal position on wafer of printed VCC overlay group (Block 3510 in FIG. 35 exposure) in column icol, ISR i", transverse overlay group offset j"; and (XWC 1,YWC 1)(irow)=nominal position on wafer of center of HCR at row=irow (XWC2,YWC2)(icol)=nominal position on wafer of center of VCC at column=icol.

Quantities that are in parentheses are known from above so the only unknowns in Equations 39 and 40 are Tx1, Ty1, Q1, Tx2, Ty2, Q2. Equations 39 and 40 can be solved by least squares or singular value decomposition techniques and the only ambiguity corresponds to three variables that geometrically corresponds to a global translation and rotation of the wafer. Therefore, when we solve Equations 39 and 40 we can uniquely specify the solution by removing global translation and rotation from the resulting solution.

Alternative Solution Technique

In the above, Equations 38, 43, 45, and 46 were solved in three successive steps. Another technique is to simultaneously solve for tx1, ty1, q1, tx2, ty2, q2 using Equations 39 and 43 above along with the stitching equations:

$$(BBXHV)(irow,icol;i,j;\ i''j'')=\{tx1(irow,i)-tx2(icol,i'',j'')-q1(irow,i)*yf(irow,i,j)+q2(icol,i'')*yf2(icol,i'',j'')\}$$ Equation 47

$$(BBYHV)(irow,icol;i,j;i''j'')=\{ty1(irow,i)-ty2(icol,i'',j'')+q1(irow,i)*xf(irow,i,j)-q2(icol,i'')*xf2(icol,i'',j'')\}$$ Equation 48 where (BBXHV, BBYHV) are the reduced overlay measurements (vide supra). Including the stitching Equations 47 and 48 and solving simultaneously along with Equations 39 and 43 reduces the ambiguity in the final solution to three parameters that correspond to a global translation (x and y) and rotation of the wafer. So, if we have any simultaneous solution to Equations 39, 43, 47 and 48 and then remove the global translation and rotation, we have a unique solution.

Wafer Stage Grid and Yaw

At this point the quantities (tx1, ty1, q1) (irow,i) are known. It remains to provide an expression for wafer stage grid (TXWS(IP), TYWS(IP)) and yaw (QWS(IP)). We have directly;

$$TXWS(IP)=\text{sum}\{irow,i\in PF(IP)|tx1(irow,i)\}/N(irow,i)$$ Equation 49

$$TYWS(IP)=\text{sum}\{irow,i\in PF(IP)|ty1(irow,i)\}/N(irow,i)$$ Equation 50

$$QWS(IP)=\text{sum}\{irow,i\in PF(IP)|q1(irow,i)\}/N(irow,i)$$ Equation 51

$$N(irow,i)=\text{sum}\{irow,i\in PF(IP)|1\}$$ Equation 52

Where:

'irow, i∈PF(IP)' means only ISRs that are contained in printed field number IP contribute to the sum.

So, N(irow,I)=number of ISRs that make up printed field number IP. Equations 49, 50 and 51 allow us to produce the stage grid and yaw error. FIG. 46 is a table illustrating an exemplary output listing of stage grid and yaw errors for a scanner operating in dynamic mode.

ALTERNATIVE EMBODIMENTS

The terms (tx1, ty1, q1) (irow,i) (vide supra) also contain the dynamic scan synchronization error for each production field scan (see Equation 53 below). The system can also report these as additional outputs to wafer stage grid and yaw.

$$tx1(irow,i)-TXWS(IP);ty1(irow,i)-TYWS(IP);q1(irow,i)-QWS(IP)$$ Equation 53

OTHER EMBODIMENTS AND VARIATIONS

Figure 47:
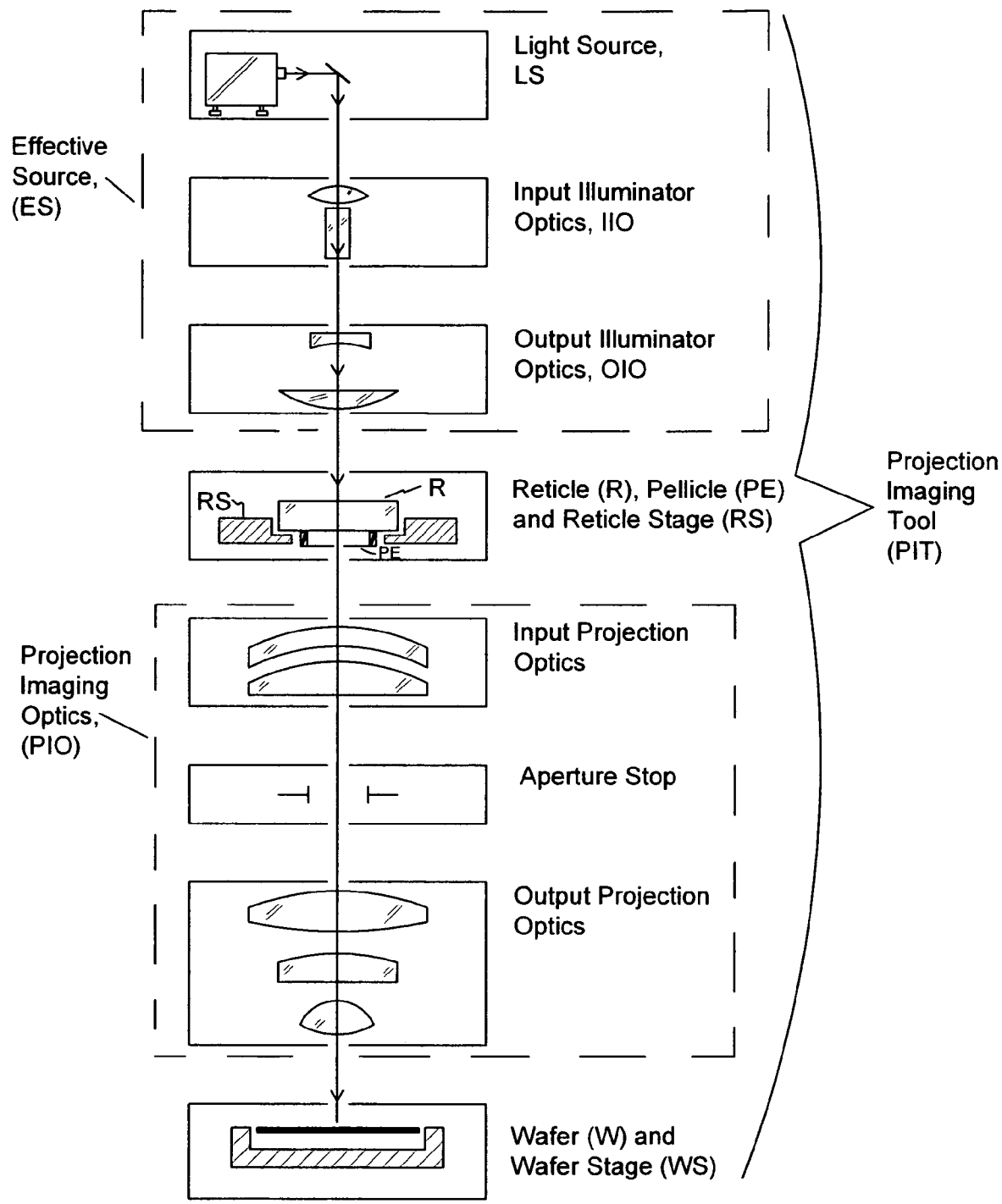
FIG. 47 is a block diagram of an example of a projection imaging tool.

FIG. 47 is a block diagram of an example of a projection imaging tool (PIT). As shown in FIG. 47, the projection imaging tool includes an effective source ES, a reticle stage RS, projection imaging optics PIO, and a wafer stage WS. The effective source ES includes a light source LS, input illuminator optics IIO and output illumination optics OIO.

The reticle stage RS holds a pellicle PE reticle(R) combination. For example, the reticle stage may be used to hold, and position, reticles configured as described in the above embodiments.

The projection imaging optics include input projection optics, an aperture stop, and output projection optics. The wafer stage WS is configured to hold and position a photo resist coated wafer.

The operation of the projection imaging system can be adjusted in response to the reconstructed wafer grid and yaw error. For example, a controller in the projection imaging system can adjust the operation of the wafer stage in response to the reconstructed wafer grid and yaw error. The positioning of the reticle relative to the substrate can be accomplished by a translation stage such as a wafer stage or a reticle stage of both. Likewise the substrate can be rotated relative to the wafer by a rotational stage, such as a wafer stage, reticle stage or both.

The techniques can be used to improve semiconductor fabrication that uses a photolithographic projection tool. For example, operation of the projection imaging system can be adjusted in response to the reconstructed wafer grid and yaw error to improve throughput, or yield, in a semiconductor fabrication process.

Heretofore, it has been considered the reticle creating the overlay patterns as perfect. In practice it is not, but errors in the reticle manufacture can be taken into account by first measuring the position of all the individual structures in all of the overlay groups using an absolute metrology tool such as the Nikon 5I (See Measuring System XY-5i, supra), or Leica LMS 3200 series tools. Next, in formulating Equations 20-23, this reticle error (divided by the photolithographic exposure tool demagnification) is explicitly written out on the right hand side and then subtracted from the resulting overlay measurements on the left hand side of the equations (thereby canceling out on the right hand side). The result is Equations 20-23 as they are written above but with a correction applied to the overlay measurements appearing on the left hand side. The analysis then proceeds word for word as before.

The reticle of the present invention is typically glass or fused silica with openings defined in a chrome coating. This is common for projection lithography tools utilized in semiconductor manufacture. The form the reticle can take will be determined by the format required by the specific projection imaging tool on which the reticle is loaded. Thus for purposes of analyzing copying machine performance, the reticle OL of the present invention would consist of a piece of paper or mylar with overlay groups disposed on it. In an extreme ultra violet (EUV) exposure tool the mask would be reflective.

Figure 3:
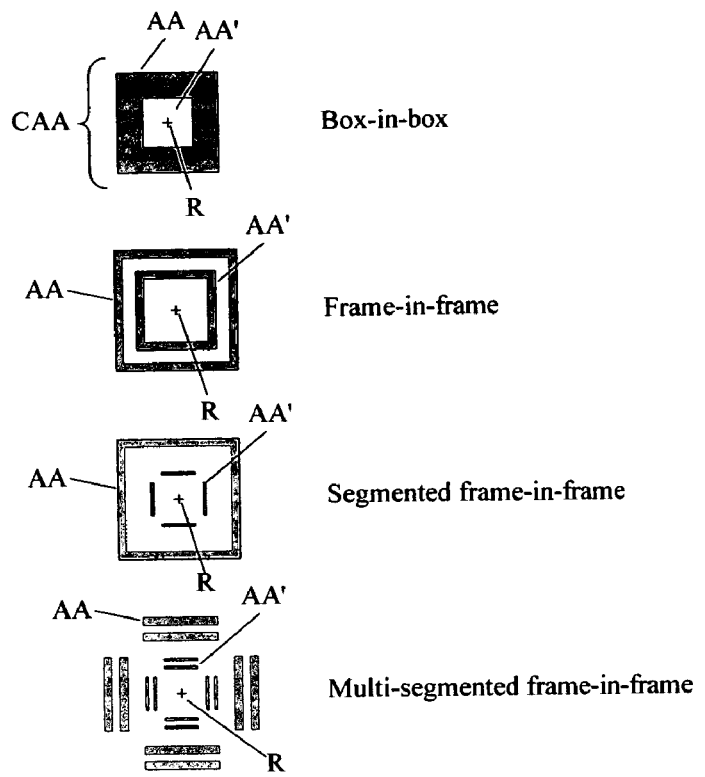
FIG. 3 shows typical overlay patterns or completed alignment attributes.
Figure 3:
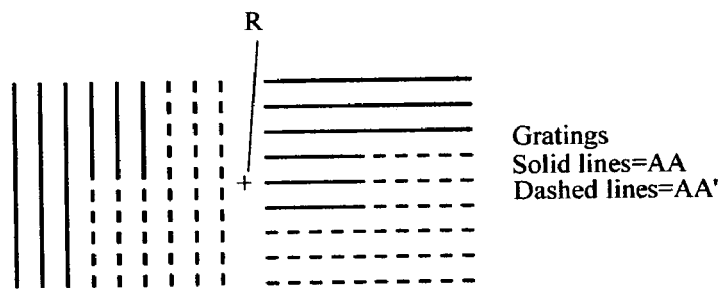
Figure 3:
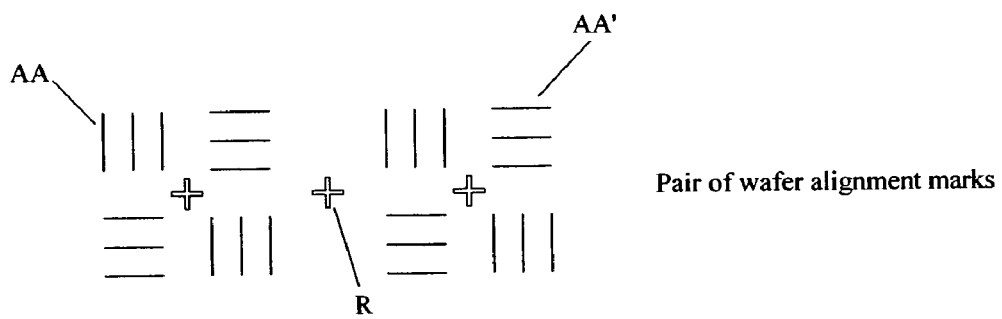

The completed alignment attributes of the present invention so far discussed are of the box in box, bar in bar, or wafer alignment marks most commonly used in semiconductor manufacture. In practice, hundreds of different overlay target patterns are available (See Handbook of Microlithography and Microfabrication, supra; Direct-Referencing Automatic Two-Points Reticle-to-Wafer Alignment Using a Projection Column Servo System, M. Van den Brink et al., SPIE Vol. 633, Optical Microlithography V, 60:71, 1986; Overlay Alignment Measurement of Wafers, N. Bareket, U.S. Pat. No. 6,079,256, Jun. 27, 2000; FIG. 1b), some common completed alignment attributes are shown in FIG. 3. The exact form taken by the completed alignment attributes will be determined by the overlay metrology used in the measurement step.

The overlay metrology tool utilized by the present invention is typically a conventional optical overlay tool such as those manufactured by KLA-Tencor (See KLA 5105 Overlay Brochure, supra; KLA 5200 Overlay Brochure, KLA-Tencor) or Bio-Rad Semiconductor Systems. See Quaestor Q7 Brochure, Bio-rad Semiconductor Systems. Other optical overlay tools that can be used by the present invention include those described in See Process for Measuring Overlay Misregistration During Semiconductor Wafer Fabrication, I. Mazor et al., U.S. Pat. No. 5,438,413, Aug. 1, 1995. In addition, some steppers or scanners (See Matching Management of Multiple Wafer Steppers Using a Stable Standard and a Matching Simulator, supra) can utilize their wafer alignment systems and wafer stages to function as overlay tools. However, in this role we would limit the total size of the alignment attribute (consisting of two wafer alignment marks) to a distance over which the wafer stage would be as accurate as a conventional optical overlay tool. This distance is typically less than about 2.0 mm. When electrical alignment attributes are used for overlay (See Matching Management of Multiple Wafer Steppers Using a Stable Standard and a Matching Simulator, supra; Automated Electrical Measurements of Registration Errors in Step and Repeat Optical Lithography Systems, T. Hasan et al., IEEE Transaction on Electron Devices, Vol. ED-27, No. 12, 2304:2312, December 1980; Capacitor Circuit Structure for Determining Overlay Error, K. Tzeng et al., U.S. Pat. No. 6,143,621, Nov. 7, 2000), the overlay metrology tool as utilized by this invention would correspond to the electrical equipment utilized for making the corresponding measurement.

The present invention has been mainly described with respect to its application on the projection imaging tools (scanners (See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448:463, 1999) commonly used in semiconductor manufacturing today. The methods of the present invention can be applied to other scanning projection tools such as; 2-dimensional scanners (See Large-Area, High-Throughput, High Resolution Projection Imaging System, Jain, U.S. Pat. No. 5,285,236, Feb. 8, 1994; Optical Lithography—Thirty Years and Three Orders of Magnitude, supra), office copy machines, and next generation lithography (ngl) systems such as XUV (See Development of XUV Projection Lithography at 60-80 nm, B. Newnam et al., SPIE Vol. 1671, 419:436, 1992), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6), 1509: 1513, November/December 1990), IPL (Ion Projection Lithography), and EPL (electron projection lithography). See Mix-and Match: A Necessary Choice, supra.

The present invention has been mainly described with respect to the recording medium being positive photoresist. The present invention could equally well have used negative photoresist providing we make appropriate adjustment to the overlay groups on the reticle. In general, the recording medium is whatever is typically used on the lithographic projection tool we are measuring. Thus, on an EPL tool, an electron beam photoresist such as PMMA could be utilized as the recording medium.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

The invention claimed is:

1. A method of calibration of a scanning projection imaging tool, the method comprising:
   exposing an overlay reticle in at least three positions onto a substrate having a recording media, thereby creating a plurality of printed fields;
   positioning the overlay reticle such that, when the reticle is exposed, completed alignment attributes are created in at least two sites comprising a first printed field and a second printed field;
   rotating the substrate a desired amount;
   positioning the overlay reticle such that, when the reticle is exposed, completed alignment attributes are created in at least two sites comprising the first printed field and third printed field;
   reconstructing wafer stage grid and yaw error of the projection imaging system from measurements of the completed complementary alignment attributes and a dynamic intra-field projection lens distortion adjusting operation of the scanning projection imaging tool in response to the reconstructed wafer stage grid and yaw error.

2. A method as defined in claim 1, wherein rotating the substrate a desired amount comprises rotating 90 degrees.

3. A method as defined in claim 1, wherein measurements of the complementary alignment attribute are made with an overlay metrology tool.

4. A method as defined in claim 1, wherein the substrate is a semiconductor wafer, a flat panel display, a reticle, or an electronic recording media.

5. A method as defined in claim 1, wherein the projection imaging tool is a photolithograph step and scan machine, a photolithographic scanner machine, a scanning electron beam imaging system, a scanning direct write tool, a scalpel tool, a scanning extreme ultra-violet photolithographic tool, or a scanning x-ray imaging system.

6. A method as defined in claim 1, wherein the recording media is a positive photoresist material, a negative photoresist material, an electronic CCD, a diode array, a liquid crystal, or an optically sensitive material.

7. A method of calibrating a scanning projection imaging tool, the method comprising:

exposing an overlay reticle in at least four positions onto a substrate having a recording media, thereby creating a plurality of printed fields;

positioning the overlay reticle such that, when the reticle is exposed, completed alignment attributes are created in at least two sites comprising a first printed field and a second printed field;

positioning the overlay reticle such that, when the reticle is exposed, completed alignment attributes are created in at least two sites comprising a third printed field and a fourth printed field;

rotating the substrate 90 degrees;

positioning the overlay reticle such that, when the reticle is exposed, completed alignment attributes are created in at least two sites comprising the first printed field and the third printed field;

positioning the overlay reticle such that, when the reticle is exposed, completed alignment attributes are created in at least two sites comprising the second printed field and the fourth printed field;

reconstructing wafer stage grid and yaw error of the projection imaging system from measurements of the complementary alignment attribute and a dynamic intra-field projection lens distortion adjusting operation of the scanning projection imaging tool in response to the reconstructed wafer stage grid and yaw error.

8. A method as defined in claim 7, wherein measurements of the complementary alignment attribute are made with an overlay metrology tool.

9. A method as defined in claim 7, wherein the substrate is a semiconductor wafer, a flat panel display, a reticle, or an electronic recording media.

10. A method as defined in claim 7, wherein the projection imaging tool is a photolithograph step and scan machine, a photolithographic scanner machine, a scanning electron beam imaging system, a scanning direct write tool, a scalpel tool, a scanning extreme ultra-violet photolithographic tool, or a scanning x-ray imaging system.

11. A method as defined in claim 7, wherein the recording media is a positive photoresist material, a negative photoresist material, an electronic CCD, a diode array, a liquid crystal, or an optically sensitive material.

12. A scanning projection imaging system comprising an overlay reticle that is exposed in at least three positions onto a substrate having a recording media, thereby creating a plurality of printed fields;

a translation stage that positions the overlay reticle relative to the substrate such that when the reticle is exposed completed alignment attributes are created in at least two sites in a first and a second printed field;

a rotation stage that rotates the substrate a desired amount, wherein the translational stage positions the overlay reticle relative to the substrate such that when the reticle is exposed completed alignment attributes are created in at least two sites in a first and third printed field; and a controller configured to adjust the operation of the scanning projection imaging system in response to a reconstructed wafer stage grid and yaw error of the projection imaging system determined from measurements of the complementary alignment attribute and a dynamic intra-field protection lens distortion, the configuration comprising the following steps:

exposing an overlay reticle in at least three positions onto a substrate having a recording media, thereby creating a plurality of printed fields:

positioning the overlay reticle such that, when the reticle is exposed, completed alignment attributes are created in at least two sites comprising a first printed field and a second printed field;

rotating the substrate a desired amount;

positioning the overlay reticle such that, when the reticle is exposed, completed alignment attributes are created in at least two sites comprising the first printed field and third printed field; and:

adjusting the operation of the projection imaging system in response to a reconstructed wafer stage grid and yaw error of the projection imaging system determined from measurements of the complementary alignment attribute and a dynamic intra-field lens distortion.

13. A projection imaging system as defined in claim 12, wherein the translation stage comprises a wafer stage.

14. A projection imaging system as defined in claim 12, wherein the translation stage comprises a reticle stage.

15. A projection imaging system as defined in claim 12, wherein the rotational stage comprises a wafer stage.

16. A projection imaging system as defined in claim 12, wherein the rotational stage comprises a reticle stage.

17. A projection imaging system as defined in claim 12, wherein the translation stage and rotational stage are the same.

18. A scanning projection imaging tool comprising:

means for exposing an overlay reticle in at least three positions onto a substrate having a recording media, thereby creating a plurality of printed fields;

means for positioning the overlay reticle such that when the reticle is exposed completed alignment attributes are created in at least two sites in a first and a second printed field;

means for rotating the substrate a desired amount;

means for positioning the overlay reticle such that when the reticle is exposed completed alignment attributes are created in at least two sites in a first and third printed field; and means for reconstructing wafer stage grid and yaw error of the scanning projection imaging system from measurements of the complementary alignment attribute and a dynamic intra-field protection lens distortion.

19. A projection imaging system as defined in claim 18, further comprising means for adjusting the operation of the projection imaging system in response to the reconstructed wafer stage grid and yaw error.

20. A scanning projection imaging tool comprising:
means for exposing an overlay reticle in at least four positions onto a substrate having a recording media, thereby creating a plurality of printed fields;
means for positioning the overlay reticle such that when the reticle is exposed completed alignment attributes are created in at least two sites in a first and a second printed field;
means for positioning the overlay reticle such that when the reticle is exposed completed alignment attributes are created in at least two sites in a third and a fourth printed field;
means for rotating the substrate 90 degrees;
means for positioning the overlay reticle such that when the reticle is exposed completed alignment attributes are created in at least two sites in the first and third printed field;
means for positioning the overlay reticle such that when the reticle is exposed completed alignment attributes are created in at least two sites in the second and fourth printed field; and
means for reconstructing wafer stage grid and yaw error of the scanning projection imaging system from measurements of the complementary alignment attribute and a dynamic intra-field projection lens distortion.

21. A projection imaging system as defined in claim 20, further comprising means for adjusting the operation of the projection imaging system in response to the reconstructed wafer stage grid and yaw error.

* * * * *

UNITED STATES PATENT AND TRADEMARK OFFICE
CERTIFICATE OF CORRECTION

| | |
|---|---|
| PATENT NO. | : 7,268,360 B2 |
| APPLICATION NO. | : 11/202707 |
| DATED | : September 11, 2007 |
| INVENTOR(S) | : Smith et al. |

It is certified that error appears in the above-identified patent and that said Letters Patent is hereby corrected as shown below:

Col. 32, Line 3
    Please amend Claim 12 as follows:

12. A scanning projection imaging system comprising
    an overlay reticle that is exposed in at least three positions onto a substrate having a recording media, thereby creating a plurality of printed fields;
    a translation stage that positions the overlay reticle relative to the substrate such that when the reticle is exposed completed alignment attributes are created in at least two sites in a first and a second printed field;
    a rotation stage that rotates the substrate a desired amount, wherein the translational stage positions the overlay reticle relative to the substrate such that when the reticle is exposed completed alignment attributes are created in at least two sites in a first and third printed field; and
    a controller configured to adjust the operation of the scanning projection imaging system in response to a reconstructed wafer stage grid and yaw error of the projection imaging system determined from measurements of the complementary alignment attribute and a dynamic intra-field projection lens distortion, the configuration comprising the following steps:
    exposing an overlay reticle in at least three positions onto a substrate having a recording media, thereby creating a plurality of printed fields [:] ;
    positioning the overlay reticle such that, when the reticle is exposed, completed alignment attributes are created in at least two sites comprising a first printed field and a second printed field;
    rotating the substrate a desired amount;
    positioning the overlay reticle such that, when the reticle is exposed, completed alignment attributes are created in at least two sites comprising the first printed field and third printed field;

UNITED STATES PATENT AND TRADEMARK OFFICE
CERTIFICATE OF CORRECTION

PATENT NO.        : 7,268,360 B2
APPLICATION NO.   : 11/202707
DATED             : September 11, 2007
INVENTOR(S)       : Smith et al.

It is certified that error appears in the above-identified patent and that said Letters Patent is hereby corrected as shown below:

Col. 32 (cont'd)
    and:
    adjusting the operation of the projection imaging system in response to a reconstructed wafer stage grid and yaw error of the projection imaging system determined from measurements of the complementary alignment attribute and a dynamic intra-field lens distortion.

Signed and Sealed this

Twenty-seventh Day of November, 2007

JON W. DUDAS
*Director of the United States Patent and Trademark Office*